United States Patent
Ziemba et al.

(10) Patent No.: US 10,607,814 B2
(45) Date of Patent: Mar. 31, 2020

(54) HIGH VOLTAGE SWITCH WITH ISOLATED POWER

(71) Applicant: Eagle Harbor Technologies, Inc., Seattle, WA (US)

(72) Inventors: Timothy M. Ziemba, Bainbridge Island, WA (US); Kenneth E. Miller, Seattle, WA (US); James R. Prager, Seattle, WA (US); John G. Carscadden, Seattle, WA (US); Ilia Slobodov, Seattle, WA (US)

(73) Assignee: Eagle Harbor Technologies, Inc., Seatle, WA (US)

( * ) Notice: Subject to any disclaimer, the term of this patent is extended or adjusted under 35 U.S.C. 154(b) by 0 days.

(21) Appl. No.: 16/178,565

(22) Filed: Nov. 1, 2018

(65) Prior Publication Data
US 2020/0051786 A1 Feb. 13, 2020

Related U.S. Application Data

(60) Provisional application No. 62/717,637, filed on Aug. 10, 2018.

(51) Int. Cl.
| | |
|---|---|
| *H01J 37/32* | (2006.01) |
| *H01F 27/24* | (2006.01) |
| *H01F 27/28* | (2006.01) |
| *H01F 38/14* | (2006.01) |
| *H02M 7/06* | (2006.01) |
| *H01L 21/687* | (2006.01) |

(52) U.S. Cl.
CPC ........ *H01J 37/32174* (2013.01); *H01F 27/24* (2013.01); *H01F 27/28* (2013.01); *H01F 38/14* (2013.01); *H01J 37/321* (2013.01); *H01J 2237/334* (2013.01); *H01L 21/687* (2013.01); *H02M 7/06* (2013.01)

(58) Field of Classification Search
CPC ............... H01J 37/32174; H01J 37/321; H01J 2237/334; H01F 38/14; H01F 27/24; H01F 27/28; H01L 21/687; H02M 7/06
USPC ..................................................... 315/111.21
See application file for complete search history.

(56) References Cited

U.S. PATENT DOCUMENTS

| | | | | |
|---|---|---|---|---|
| 10,009,024 | B2* | 6/2018 | Gan ........................ | H03K 17/61 |
| 2006/0192774 | A1* | 8/2006 | Yasumura ............... | H02M 1/10 |
| | | | | 345/211 |
| 2010/0148847 | A1* | 6/2010 | Schurack ........... | H03K 17/0822 |
| | | | | 327/396 |
| 2011/0140607 | A1* | 6/2011 | Moore .................. | A61B 18/042 |
| | | | | 315/111.21 |
| 2014/0021180 | A1* | 1/2014 | Vogel ................... | B23K 9/1043 |
| | | | | 219/130.1 |
| 2015/0311680 | A1* | 10/2015 | Burrows .................... | F02P 3/01 |
| | | | | 315/210 |
| 2018/0226896 | A1* | 8/2018 | Miller ............... | H02M 3/33592 |

\* cited by examiner

*Primary Examiner* — Don P Le

(57) ABSTRACT

A high voltage switch comprising: a high voltage power supply providing power greater than about 5 kV; a control voltage power source; a plurality of switch modules arranged in series with respect to each other each of the plurality of switch modules configured to switch power from the high voltage power supply, and an output configured to output a pulsed output signal having a voltage greater than the rating of any switch of the plurality of switch modules, a pulse width less than 2 μs, and at a pulse frequency greater than 10 kHz.

28 Claims, 15 Drawing Sheets

HIGH VOLTAGE SWITCH WITH ISOLATED POWER

BACKGROUND

Producing high voltage pulses with fast rise times and/or fast fall times is challenging. For instance, to achieve a fast rise time and/or a fast fall time (e.g., less than about 50 ns) for a high voltage pulse (e.g., greater than about 5 kV), the slope of the pulse rise and/or fall must be incredibly steep (e.g., greater than $10^{11}$ V/s). Such steep rise times and/or fall times are very difficult to produce especially in circuits driving a load with high capacitance. Such pulse may be especially difficult to produce using standard electrical components in a compact manner; and/or with pulses having variable pulse widths, voltages, and repetition rates; and/or within applications having capacitive loads such as, for example, a plasma.

SUMMARY

A high voltage switch is disclosed comprising: a high voltage power supply having a voltage greater than 5 kV; a first switch module comprising: a first switch having a first voltage rating; a first transformer electrically coupled with a control voltage power source and electrically coupled with the first switch, providing a voltage less than the first voltage rating; and a first switch trigger electrically coupled with the first switch; a second switch module arranged in series with the first switch module, the second switch module comprising: a second switch having a second voltage rating; a second transformer electrically coupled with the control voltage power source and electrically coupled with the second switch, providing a voltage less than the second voltage rating; and a second switch trigger electrically coupled with the second switch, and an output configured to output switched pulses from the high voltage power supply where the output pulse voltage is greater than either the first switch voltage rating and/or the second switch voltage rating.

In some embodiments, the first switch trigger produces a trigger having a rise time less than about 20 ns. In some embodiments, the switched pulses have a frequency greater than about 40 kHz. In some embodiments, the switched pulses have a rise time less than about 75 ns. In some embodiments, the switched pulses have a fall time less than 100 ns. In some embodiments, the period of time where the first switch is closed while the second switch is open is less than 1 ms. In some embodiments, the stray capacitance of the high voltage switch is less than about 100 pF. In some embodiments, the stray inductance of either or both the first switch module or the second switch module less than 300 nH. In some embodiments, the control voltage power source provides AC line voltages and frequencies. In some embodiments, the control voltage power source provides 120 VAC at 60 Hz. In some embodiments, the any one of the secondary windings may have a stray capacitance with the primary of less than 100 pF.

In some embodiments, the high voltage switch may include a transformer core; and a plurality of primary windings wound around the transformer core, the plurality of primary windings being electrically coupled with the control voltage power source, wherein the first transformer comprises the transformer core, the plurality of primary windings, and a first plurality of secondary windings wound around the transformer core; and wherein the second transformer comprises the transformer core, the plurality of primary windings, and a second plurality of secondary windings wound around the transformer core.

A high voltage switch is disclosed comprising: a high voltage power supply providing power greater than about 5 kV; a control voltage power source; a plurality of switch modules arranged in series with respect to each other, each of the plurality of switch modules configured to switch power from the high voltage power supply, each of the plurality of switch modules comprising: a switch having a collector, an emitter, and a gate; a transformer electrically coupled with the control voltage power source and electrically or inductively coupled with the switch; and a gate trigger electrically coupled with the gate of the switch, wherein the switch is opened and closed based on a signal from the gate trigger; and an output configured to output a pulsed output signal having a voltage greater than the rating of any switch of the plurality of switches, a pulse width less than 2 µs, and at a pulse frequency greater than 10 kHz.

In some embodiments, the pulsed output signal includes pulses having a rate of rise greater than $10^{11}$ V/s. In some embodiments, the one or more switch modules of the plurality of switch modules produce less than 50 ns of jitter. In some embodiments, the output is coupled with a plasma load.

In some embodiments, the transformer comprises a transformer core and a secondary winding, wherein the average gap between the transformer core and the majority of the secondary winding is greater than 0.5 inches. In some embodiments, the transformer comprises a transformer core, a primary winding, and a secondary winding, wherein the average gap between the majority of the primary winding and the majority of the secondary winding is greater than 0.5 inches.

In some embodiments, each switch module is configured to switch at least 5 W of power. In some embodiments, the transformer comprises a transformer core and a secondary winding, wherein the secondary winding comprises a plurality of wires having a cross section with a width to thickness ratio less than 3. In some embodiments, the gate trigger comprises an isolated fiber optic trigger.

Some embodiments may include a method comprising: closing a first switch of a plurality of switches, the plurality of switches comprising n switches, while opening n−1 switches of the plurality of switches for a first plurality of time, wherein the plurality of switches are electrically coupled with a power supply that produces a high voltage V that is greater than 5 kV; outputting an output switched pulses with a voltage $$\frac{1}{n}V$$

on a load; closing a second switch of the plurality of switches while opening n−2 switches of the plurality of switches for a second period of time; outputting the output switched pulses with a voltage $$\frac{2}{n}V$$

on the load; closing a second-to-last switch of the plurality of switches while opening one switches of the plurality of switches for a second-to-last period of time; outputting the output switched pulses with a voltage $$\frac{n-1}{n}V$$

on the load; closing an $n^{th}$ switch of the plurality of switches for an $n^{th}$ period of time; and outputting the output switched pulses with a voltage V on the load.

In some embodiments, one or more of the first period of time, the second period of time, the second-to-last period of time, and the $n^{th}$ period of time are less than 100 ms. In some embodiments, the output switched pulses have a rise time less than about 20 ns. In some embodiments, the output switched pulses have a frequency greater than about 10 kHz.

BRIEF DESCRIPTION OF THE DRAWINGS

These and other features, aspects, and advantages of the present disclosure are better understood when the following Detailed Description is read with reference to the accompanying drawings.

DETAILED DESCRIPTION

A high voltage switch is disclosed. A high voltage switch may include a high voltage power supply, a plurality of switch modules arranged in series, and an output configured to output switched pulses from the power supply with voltages greater than 5 kV, with rise times less than about 100 ns, a rise greater than $10^{11}$ V/s, a pulse width less than 2 µs, and/or frequencies greater than about 10 kHz. In some embodiments, the plurality of switches may be trigged by respective gate driver circuits that are electrically isolated from other components. In some embodiments, each switch module may include a switch (e.g., a solid-state switch) having a collector, an emitter, and a gate; or a switch having drain, source, and gate; and/or a snubber circuit.

In some embodiments, the high voltage switch may include a plurality of solid-state switches arranged to collectively switch voltages from about 10 kV to about 400 kV. In some embodiments, the high voltage switch may switch with frequencies up to about 2,000 kHz. In some embodiments, the high voltage switch may provide single pulses of varying pulse widths from about 50 seconds down to about 1 nanosecond. In some embodiments, the high voltage switch may switch at frequencies greater than about 10 kHz. In some embodiments, the high voltage switch may operate with rise times less than about 20 ns. In some embodiments, the high voltage switch may include fiber optic and/or control voltage isolation. In some embodiments, a plurality of high voltage switches may be electrically coupled together in parallel.

As used throughout this document, the term "high voltage" may include a voltage greater than about 1 kV, 10 kV, 20 kV, 50 kV, 100 kV, 1,000 kV, etc.; the term "high frequency" may be a frequency greater than about 1 kHz, 10 kHz, 100 kHz, 200 kHz, 500 kHz, 1 MHz, etc.; the term "high repetition rate" may be a rate greater than about 1 kHz, 10 kHz, 100 kHz, 200 kHz, 500 kHz, 1 MHz, etc., the term "fast rise time" may include a rise time less than about 1 ns, 10 ns, 50 ns, 100 ns, 250 ns, 500 ns, 1,000 ns, etc.; the term "fast fall time" may include a fall time less than about 1 ns, 10 ns, 50 ns, 100 ns, 250 ns, 500 ns, 1,000 ns, etc.; the term "low capacitance" may include capacitance less than about 1.0 pF, 10 pF, 100 pF, 1,000 pF, etc.; the term "low inductance" may include inductance less than about 10 nH, 100 nH, 1,000 nH, 10,000 nH, etc.; and the term short pulse width may include pulse widths less than about 10,000 ns, 1,000 ns, 500 ns, 250 ns, 100 ns, 20 ns, etc.

Figure 1:
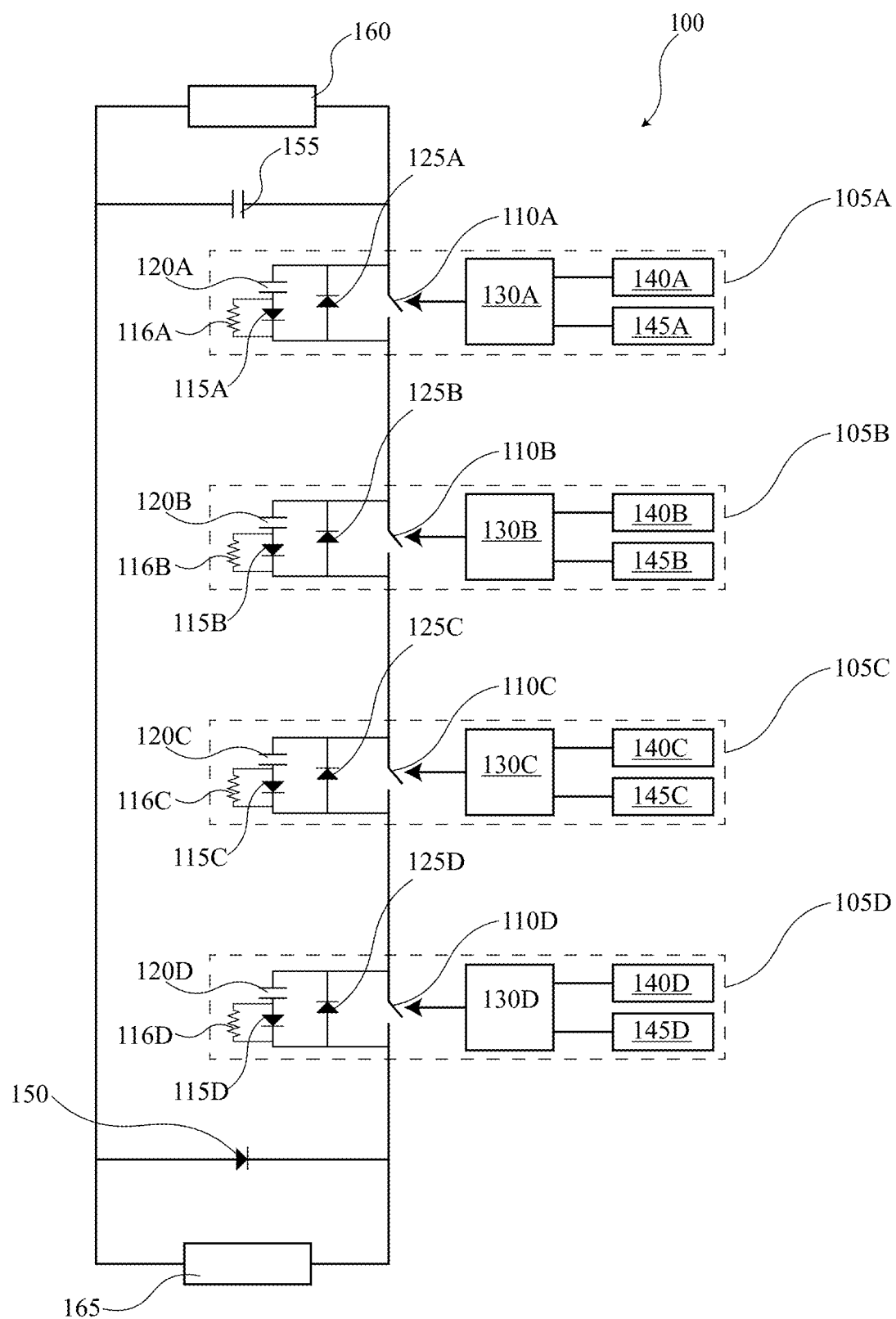
FIG. 1 is a block diagram of a high voltage switch with isolated power according to some embodiments.

FIG. 1 is a block diagram of a high voltage switch 100 with isolated power according to some embodiments. The high voltage switch 100 may include a plurality of switch modules 105 (collectively or individually 105, and individually 105A, 105B, 105C, and 105D) that may switch voltage from a high voltage source 160 with fast rise times and/or high frequencies and/or with variable pulse widths. Each switch module 105 may include a switch 110 such as, for example, a solid state switch.

In some embodiments, the switch 110 may be electrically coupled with a gate driver circuit 130 that may include a power supply 140 and/or an isolated fiber trigger 145 (also referred to as a gate trigger or a switch trigger). For example, the switch 110 may include a collector, an emitter, and a gate (or a drain, a source, and a gate) and the power supply 140 may drive the gate of the switch 110 via the gate driver circuit 130. The gate driver circuit 130 may, for example, be isolated from the other components of the high voltage switch 100.

Figure 3:
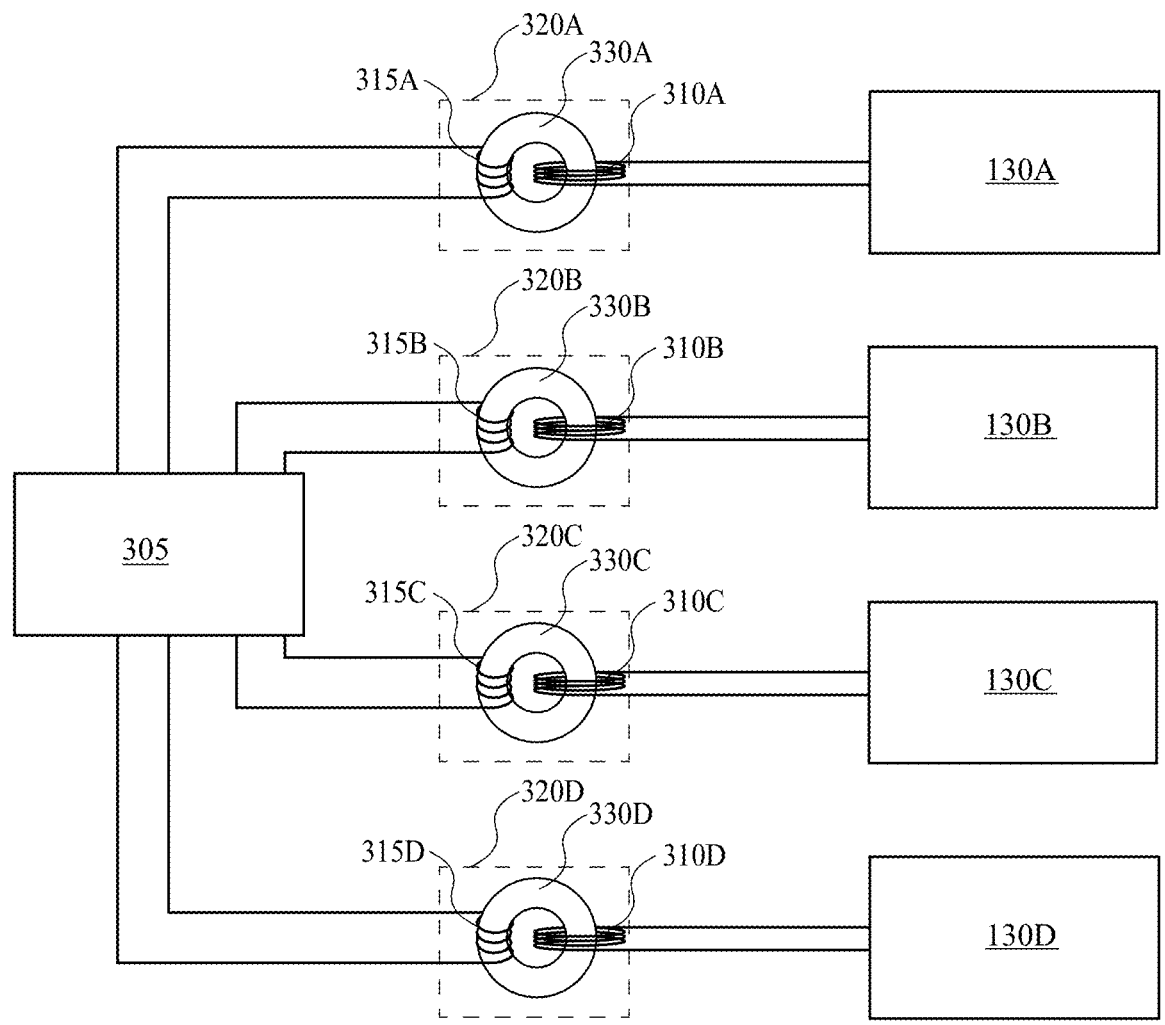
FIG. 3 illustrates an isolation transformer arrangement according to some embodiments.
Figure 4:
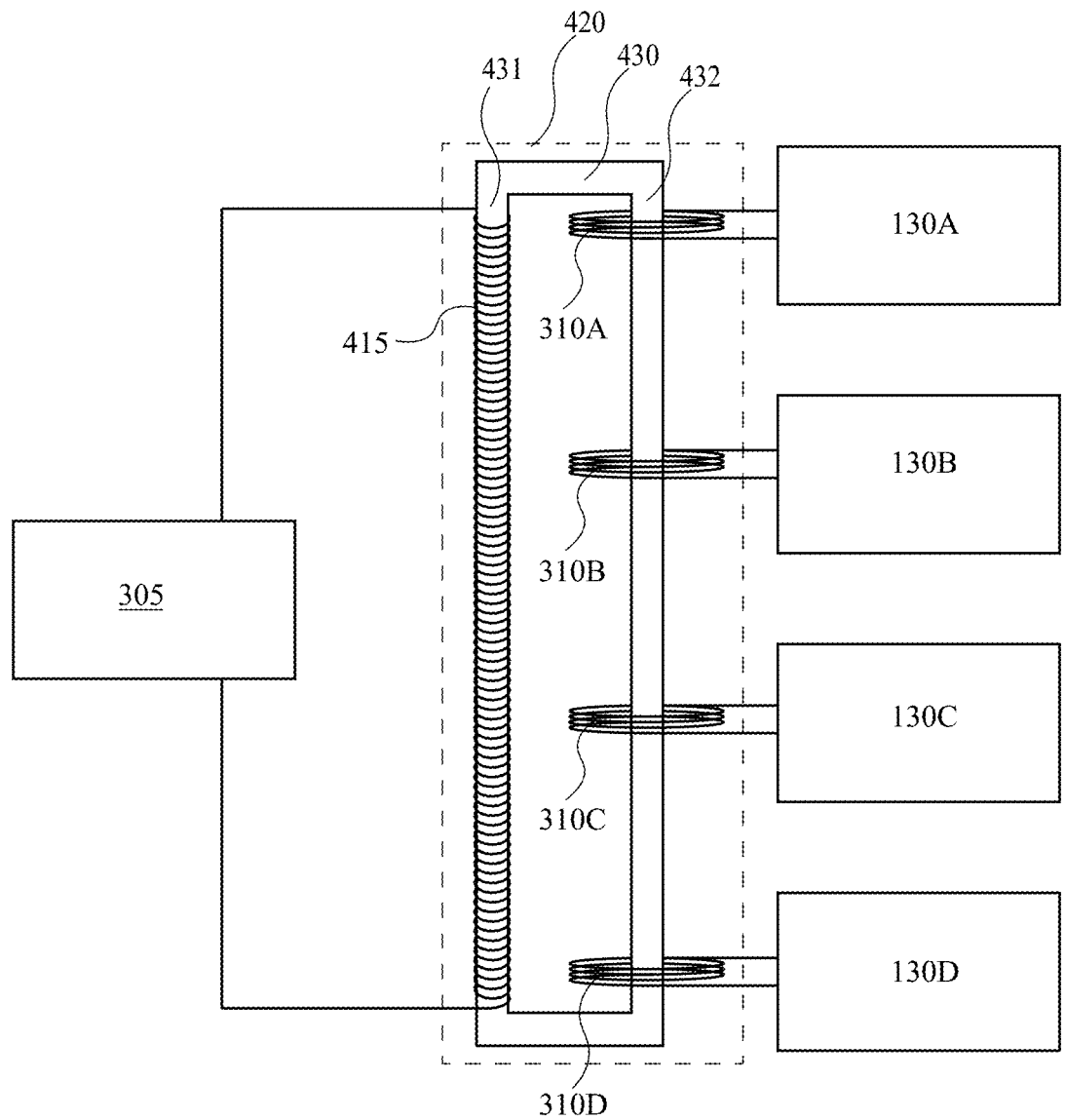
FIG. 4 illustrates an isolation transformer arrangement according to some embodiments.

In some embodiments, the power supply 140 may be isolated, for example, using an isolation transformer. The isolation transformer may include a low capacitance transformer. The low capacitance of the isolation transformer may, for example, allow the power supply 140 to charge on fast time scales without requiring significant current. The isolation transformer may have a capacitance less than, for example, about 100 pF. As another example, the isolation transformer may have a capacitance less than about 30-100 pF. In some embodiments, the isolation transformer may provide voltage isolation up to 5 kV, 10 kV, 25 kV, 50 kV, etc. An example arrangement of isolation transformers is shown in FIG. 3 and a single isolation transformer is shown in FIG. 4.

In some embodiments, the isolation transformer may have a low stray capacitance. For example, the isolation transformer may have a stray capacitance less than about 1,000 pF, 100 pF, 10 pF, etc. In some embodiments, low capacitance may minimize electrical coupling to low voltage components (e.g., the source of the input control power) and/or may reduce EMI generation (e.g., electrical noise generation). In some embodiments, the transformer stray capacitance of the isolation transformer may include the capacitance measured between the primary winding and secondary winding.

In some embodiments, the isolation transformer may be a DC to DC converter or an AC to DC transformer. In some embodiments, the transformer, for example, may include a 110 V AC transformer. Regardless, the isolation transformer can provide isolated power from other components in the high voltage switch 100. In some embodiments, the isolation may be galvanic, such that no conductor on the primary side of the isolation transformer passes through or makes contact with any conductor on the secondary side of the isolation transformer.

In some embodiments, the transformer may include a primary winding that may be wound and/or wrapped tightly around the transformer core. In some embodiments, the primary winding may include a conductive sheet that is wrapped around the transformer core. In some embodiments, the primary winding may include one or more windings.

In some embodiments, a secondary winding may be wound around the core as far from the core as possible. For example, the bundle of windings comprising the secondary winding may be wound through the center of the aperture in the transformer core. In some embodiments, the secondary winding may include one or more windings. In some embodiments, the bundle of wires comprising the secondary winding may include a cross section that is circular or square, for example, to minimize stray capacitance. In some embodiments, an insulator (e.g., oil or air) may be disposed between the primary winding, the secondary winding, and/or the transformer core.

In some embodiments, keeping the secondary winding far from the transformer core may have some benefits. For example, it may reduce the stray capacitance between the primary side of the isolation transformer and secondary side of the isolation transformer. As another example, it may allow for high voltage standoff between the primary side of the isolation transformer and the secondary side of the isolation transformer, such that corona and/or breakdown is not formed during operation.

In some embodiments, spacings between the primary side (e.g., the primary windings) of the isolation transformer and the secondary side of the isolation transformer (e.g., the secondary windings) can be about 0.1", 0.5", 1", 5", or 10". In some embodiments, typical spacings between the core of the isolation transformer and the secondary side of the isolation transformer (e.g., the secondary windings) can be about 0.1", 0.5", 1", 5", or 10". In some embodiments, the gap between the windings may be filled with the lowest dielectric material possible such as, for example, vacuum, air, any insulating gas or liquid, and/or solid materials with a relative dielectric constant less than 3.

In some embodiments, the power supply 140 may include any type of power supply that can provide high voltage standoff (isolation) and/or have low capacitance (e.g., less than about 1,000 pF, 100 pF, 10 pF, etc.). In some embodiments, the control voltage power source may supply 120 V AC or 240 V AC at 60 Hz.

In some embodiments, each power supply 140 may be inductively electrically coupled with a single control voltage power source (e.g., as shown in FIG. 3 or FIG. 4). For example, the power supply 140A may be electrically coupled with the power source via a first transformer; the power supply 140B may be electrically coupled with the power source via a second transformer; the power supply 140C may be electrically coupled with the power source via a third transformer; and the power supply 140D may be electrically coupled with the power source via a fourth transformer. Any type of transformer, for example, may be used that can provide voltage isolation between the various power supplies.

In some embodiments, the first transformer, the second transformer, the third transformer, and the fourth transformer may comprise different secondary winding around a core of a single transformer (e.g., as shown in FIG. 4). For example, the first transformer may comprise a first secondary winding, the second transformer may comprise a second secondary winding, the third transformer may comprise a third secondary winding, and the fourth transformer may comprise a fourth secondary winding. Each of these secondary winding may be wound around the core of a single transformer. In some embodiments, the first secondary winding, the second secondary winding, the third secondary winding, the fourth secondary winding, and/or the primary winding may comprise a single winding or a plurality of windings wound around the transformer core.

In some embodiments, the power supply 140A, the power supply 140B, the power supply 140C, and/or the power supply 140D may not share a return reference ground and/or a local ground.

The isolated fiber trigger 145, for example, may also be isolated from other components of the high voltage switch 100. The isolated fiber trigger 145 may include a fiber optic receiver that allows each switch module 105 to float relative to other switch modules 105 and/or the other components of the high voltage switch 100, and/or, for example, while allowing for active control of the gates of each switch module 105.

In some embodiments, return reference grounds and/or local grounds and/or common grounds for each switch module 105, for example, may be isolated from one another, for example, using an isolation transformer such as, for example, the transformer arrangement shown in either FIG. 3 or FIG. 4.

Electrical isolation of each switch module 105 from common ground, for example, can allow multiple switches to be arranged in a series configuration for cumulative high voltage switching. In some embodiments, some lag in switch module timing may be allowed or designed (e.g., see FIG. 12A and FIG. 12B). For example, each switch module 105 may be configured or rated to switch 1 kV, each switch module may be electrically isolated from each other, and/or the timing of closing each switch module 105 may not need to be perfectly aligned for a period of time defined by the capacitance of the snubber capacitor and/or the voltage rating of the switch.

In some embodiments, electrical isolation may provide many advantages. One possible advantage, for example, may include minimizing switch to switch jitter and/or allowing for arbitrary switch timing. For example, each switch 110 may have switch transition jitters less than about 500 ns, 50 ns, 20 ns, 5 ns, etc.

In some embodiments, electrical isolation between two components (or circuits) may imply extremely high resistance between two components and/or may imply a small capacitance between the two components.

Each switch 110 may include any type of silicon switching device such as, for example, an IGBT, a MOSFET, a SiC MOSFET, SiC junction transistor, FETs, SiC switches, GaN switches, photoconductive switch, etc. The switch 110, for example, may be able to switch high voltages (e.g., voltages greater than about 1 kV), with high frequency (e.g., greater than 1 kHz), at high speeds (e.g., a repetition rate greater than about 500 kHz) and/or with fast rise times (e.g., a rise time less than about 25 ns) and/or with long pulse lengths (e.g., greater than about 10 ms). In some embodiments, each switch may be individually rated for switching 1,200 V-1, 700 V, yet in combination can switch greater than 4,800 V-6,800 V (for four switches). Switches with various other voltage ratings may be used.

There may be some advantages to using a large number of lower voltage switches rather than a few higher voltage switches. For example, lower voltage switches typically have better performance: lower voltage switches may switch faster, may have faster transition times, and/or may switch more efficiently than high voltage switches. However, the greater the number of switches the greater the timing issues that may be required.

The high voltage switch 100 shown in FIG. 1 includes four switch modules 105. While four are shown in this figure, any number of switch modules 105 may be used such as, for example, eight, twelve, sixteen, twenty, twenty-four, etc. For example, if each switch in each switch module 105 is rated at 1200 V, and sixteen switches are used, then the high voltage switch can switch up to 19.2 kV. As another example, if each switch in each switch module 105 is rated at 1700 V, and sixteen switches are used, then the high voltage switch can switch up to 27.2 kV.

In some embodiments, the high voltage switch 100 may include a fast capacitor 155. The fast capacitor 155, for example, may include one or more capacitors arranged in series and/or in parallel. These capacitors may, for example, include one or more polypropylene capacitors. The fast capacitor 155 may store energy from the high voltage source 160.

In some embodiments, the fast capacitor 155 may have low capacitance. In some embodiments, the fast capacitor 155 may have a capacitance value of about 1 µF, about 5 µF, between about 1 µF and about 5 µF, between about 100 nF and about 1,000 nF etc.

In some embodiments, the high voltage switch 100 may or may not include a crowbar diode 150. The crowbar diode 150 may include a plurality of diodes that may, for example, be beneficial for driving inductive loads. In some embodiments, the crowbar diode 150 may include one or more Schottky diodes such as, for example, a silicon carbide Schottky diode. The crowbar diode 150 may, for example, sense whether the voltage from the switches of the high voltage switch is above a certain threshold. If it is, then the crowbar diode 150 may short the power from switch modules to ground. The crowbar diode, for example, may allow an alternating current path to dissipate energy stored in the inductive load after switching. This may, for example, prevent large inductive voltage spikes. In some embodiments, the crowbar diode 150 may have low inductance such as, for example, 1 nH, 10 nH, 100 nH, etc. In some embodiments, the crowbar diode 150 may have low capacitance such as, for example, 100 pF, 1 nF, 10 nF, 100 nF, etc.

In some embodiments, the crowbar diode 150 may not be used such as, for example, when the load 165 is primarily resistive.

In some embodiments, each gate driver circuit 130 may produce less than about 1000 ns, 100 ns, 10.0 ns, 5.0 ns, 3.0 ns, 1.0 ns, etc. of jitter. In some embodiments, each switch 110 may have a minimum switch on time (e.g., less than about 10 µs, 1 µs, 500 ns, 100 ns, 50 ns, 10, 5 ns, etc.) and a maximum switch on time (e.g., greater than 25 s, 10 s, 5 s, 1 s, 500 ms, etc.).

In some embodiments, during operation each of the high voltage switches may be switched on and/or off within 1 ns of each other.

In some embodiments, each switch module 105 may have the same or substantially the same (±5%) stray inductance. Stray inductance may include any inductance within the switch module 105 that is not associated with an inductor such as, for example, inductance in leads, diodes, resistors, switch 110, and/or circuit board traces, etc. The stray inductance within each switch module 105 may include low inductance such as, for example, an inductance less than about 100 nH, 10 nH, 1 nH, etc. The stray inductance between each switch module 105 may include low inductance such as, for example, an inductance less than about 300 nH, 100 nH, 10 nH, 1 nH, etc.

In some embodiments, each switch module 105 may have the same or substantially the same (±5%) stray capacitance. Stray capacitance may include any capacitance within the switch module 105 that is not associated with a capacitor such as, for example, capacitance in leads, diodes, resistors, switch 110 and/or circuit board traces, etc. The stray capacitance within each switch module 105 may include low capacitance such as, for example, less than about 1,000 pF, 100 pF, 10 pF, etc. The stray capacitance between each switch module 105 may include low capacitance such as, for example, less than about 1,000 pF, 100 pF, 10 pF, etc.

Imperfections in voltage sharing can be addressed, for example, with a passive snubber circuit (e.g., the snubber diode 115, the snubber capacitor 120, and/or the freewheeling diode 125). For example, small differences in the timing between when each of the switches 110 turn on or turn off or differences in the inductance or capacitances may lead to voltage spikes. These spikes can be mitigated by the various snubber circuits (e.g., the snubber diode 115, the snubber capacitor 120, and/or the freewheeling diode 125). This mitigation can allow for stepwise high voltage waveforms as demonstrated in the stepping waveforms shown in FIGS. 12A and 12B.

A snubber circuit, for example, may include a snubber diode 115, a snubber capacitor 120, a snubber resistor 116, and/or a freewheeling diode 125. In some embodiments, the snubber circuit may be arranged together in parallel with the switch 110. In some embodiments, the snubber capacitor 120 may have low capacitance such as, for example, a capacitance less than about 100 pF.

In some embodiments, the high voltage switch 100 may be electrically coupled with or include a resistive load 165. The resistive load 165, for example, may have a resistance from 50 ohms to 500 ohms. Alternatively or additionally, the load 165 may be an inductive load.

Figure 2:
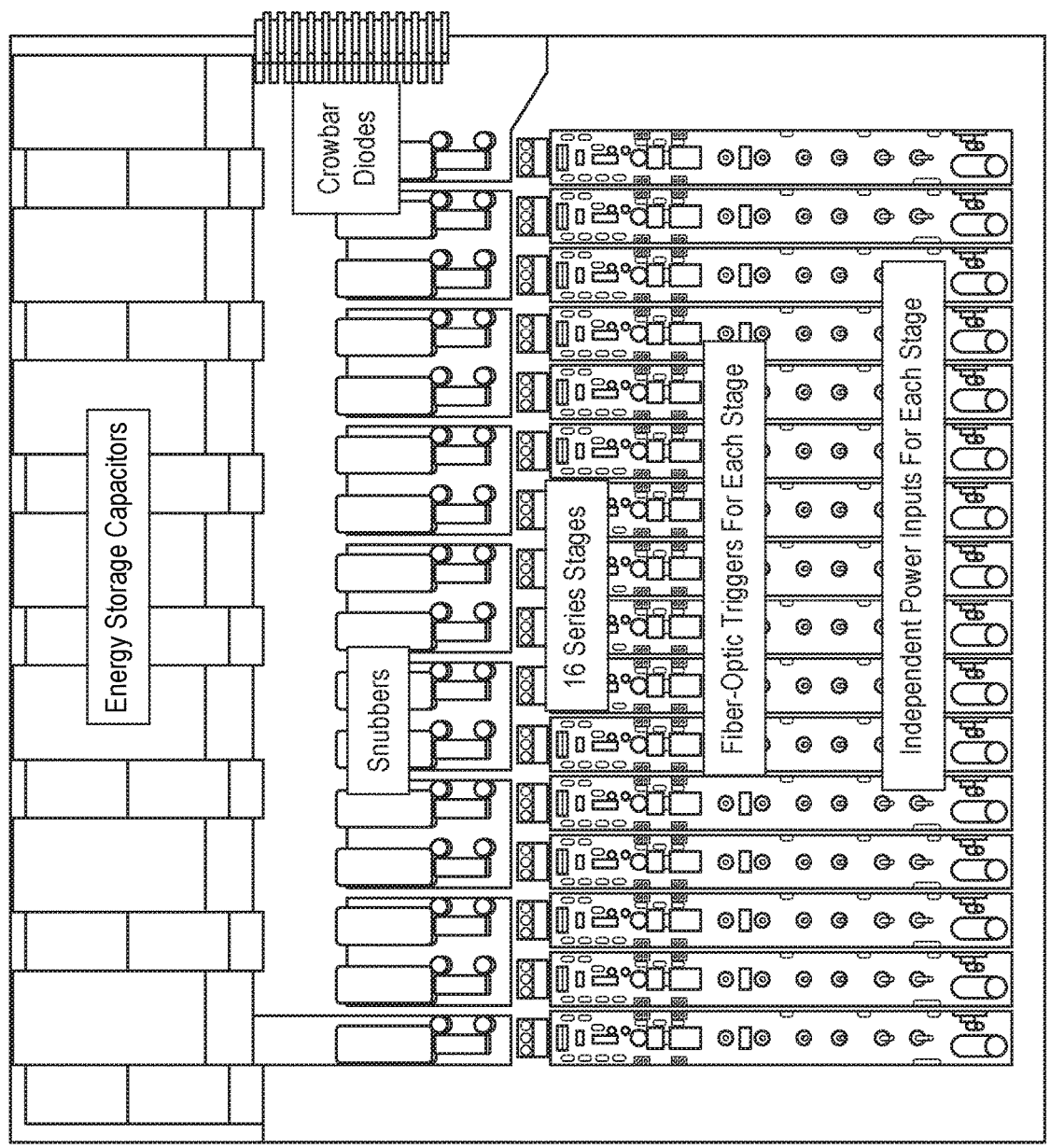
FIG. 2 is an image of high voltage switch according to some embodiments.

FIG. 2 is an image of an example high voltage switch according to some embodiments. In this example, the high voltage switch includes a plurality of independent power inputs (e.g., power supplies 140), a plurality of fiber-optic triggers (e.g., isolated fiber trigger 145), a plurality of switch stages (e.g., switches 110), a plurality of snubber components (e.g., the snubber diode 115, the snubber capacitor 120, and/or the freewheeling diode 125), a plurality of crowbar diodes (e.g., crowbar diode 150), and a plurality of energy storage capacitors (e.g., fast capacitor 155).

FIG. 3 illustrates a block diagram of an arrangement of isolation transformers according to some embodiments. In this embodiment, a plurality of isolation transformers 320 (collectively or individually 320, and individually 320A, 320B, 320C, 320D) may be electrically coupled with a control voltage power source 305 and a plurality of gate driver circuits 130. In some embodiments, the control voltage power source 305 may include any power supply that can provide AC or DC power to the isolation transformers 320 such as, for example, 120 V AC or 240 V AC at 60 Hz. In some embodiments, the control voltage power source 305 may provide power greater than 1 W, 10 W, 100 W, for example. In some embodiments, the control voltage power source 305 may provide a voltage greater than 10 V, or 100 V, for example. In some embodiments, control voltage power source 305 may comprise one or more power supplies.

Each of the plurality of isolation transformers 320, may include a transformer core 330 (collectively or individually 330, and individually 330A, 330B, 330C, 330D), a primary winding 315 (collectively or individually 315, and individually 315A, 315B, 315C, 315D), and/or a secondary winding 310 (collectively or individually 310, and individually 310A, 310B, 310C, 310D). Any number of isolation transformers 320 may be used. The control voltage power source 305 may be electrically coupled with each primary winding 315.

Each primary winding 315 may include any number of individual windings of wire that are wound about a respective one of the transformer cores 330. In some embodiments, the primary winding 315 may be tightly wound around the transformer core 330. In some embodiments, the primary winding 315 may include a conductive sheet that is wound, wrapped, or draped around the transformer core but is not electrically coupled with the transformer core 330.

In some embodiments, the secondary winding 310 may be wound around the transformer core 330 with as much space between the transformer core 330 and the secondary winding 310 as possible. For example, the secondary winding 310 may pass through the center of the aperture in the transformer core 330. In some embodiments, the secondary winding 310 may comprise a bundle of wires with a small surface area such as, for example, a bundle that has a circular cross-section (see FIG. 5A), a square cross-section (see FIG. 5B), an elliptical cross-section (see FIG. 5C), and/or a rectangular cross-section (See FIG. 5D). Various other cross-sections may be used. The small surface area and/or the distance from the center of the transformer core may, for example, result in a lower capacitance.

In some embodiments, the secondary winding 310 may be arranged relative to the primary winding 315 with as much space between the primary winding 315 and the secondary winding 310 as possible. In some embodiments, the primary winding 315 may comprise a bundle of wires with a small surface area such as, for example, a bundle that has a circular cross-section (see FIG. 5A), square cross-section (see FIG. 5B), an elliptical cross-section (see FIG. 5C), and/or a rectangular cross-section (See FIG. 5D). Various other bundle cross-sections may be used. The small surface area and/or the distance from the center of the transformer core may, for example, result in a lower capacitance.

Each of the transformer cores 330, for example, may be a toroid-shaped core, a square-shaped core, a rectangular-shaped core, or a rod-shaped core. Each of the transformer cores 330 may be comprised of iron, ferrite, soft ferrite, MnZn, NiZn, hard ferrite, powder, nickel-iron alloys, amorphous metal, glassy metal, or some combination thereof.

In some embodiments, each of the isolation transformers 320 may have an effective/equivalent capacitance (e.g., the stray capacitance between the primary winding and the secondary winding) of less than about 100 pF, 10 pF, 1 pF, etc.

In some embodiments, each secondary winding 310 may include a wire wound around a respective one of the transformer cores 330. In this example, for each secondary winding 310, the ratio of the number of each winding around the core to the number of primary winding 315 wound around the core may determine the voltage delivered from each of the secondary winding 310. In some embodiments, each secondary winding 310 may be electrically coupled with a corresponding gate driver circuit 130.

In some embodiments, a ground of the control voltage power source 305 is not electrically coupled with a common ground associated with each or any secondary winding 310 and/or a ground associated with each or any of the gate drivers 130. As another example, the common ground of the control voltage power source 305, the ground of each secondary winding 310 and/or the common ground associated with each of the gate drivers 130 may float relative to each other.

FIG. 4 illustrates a block diagram of an isolation transformer arrangement according to some embodiments. The isolation transformer 420 may be electrically coupled with a control voltage power source 305 and/or a plurality of gate driver circuits 130. The control voltage power source 305 may include any power supply that can provide AC power to the isolation transformer 420. control voltage power source 305 control voltage power source 305

The isolation transformer 420 may include a transformer core 430, a primary winding 415, and/or a plurality of secondary windings 310.

In this example, the transformer core 430 comprises a rectangular shaped core with an interior aperture having a first core leg 431 and a second core leg 432. The transformer core 430 may be comprised of iron, ferrite, soft ferrite, MnZn, NiZn, hard ferrite, powder, nickel-iron alloys, amorphous metal, glassy metal, or some combination thereof.

The control voltage power source 305 may be electrically coupled with the primary winding 415. The primary winding 415 may include wires wound around the first core leg 431 of the transformer core 430. In some embodiments, the primary winding 415 may be wound and/or wrapped tightly around the first core leg 431 of the transformer core 430. In some embodiments, the primary winding 415 may include a conductive sheet that is draped around the first core leg 431 of the transformer core 430. The primary winding may be wrapped around any of the legs or sides of the transformer core 430, and multiple primaries may be used in parallel.

In some embodiments, the isolation transformer 420 may have an effective/equivalent capacitance of less than about 100 pF, 10 pF, 1 pF, etc.

In some embodiments, a plurality of different secondary winding 310 may be wound around the second core leg 432 of the transformer core 430 or any leg or portion of the transformer core 430. Each secondary winding 310 may include a wire that is wound a number of times around a transformer core 430. In this example, four different secondary winding 310 are represented. Any number of secondary winding may be included. For each secondary winding, the ratio of the number of each winding around the core to the number of primary winding 415 wound around the core may determine the voltage delivered from each of the secondary winding 310. In some embodiments, each secondary winding 310 may be electrically coupled with a corresponding gate driver circuit 130. As shown in FIG. 4, four secondary winding 310 are electrically coupled with a respective one of four different gate driver circuit 130.

In some embodiments, the secondary winding 310 may be wound around the second core leg 432 of the transformer core 430 with as much space between the transformer core 330 and the secondary winding 310 as possible and/or with as much space between the primary winding 415 and the secondary winding 310 as possible. For example, the secondary winding 310 may pass through the center of the aperture in the transformer core 430. In some embodiments, the secondary winding 310 may comprise a bundle of wires with a small surface area such as, for example, a bundle that has a circular cross-section (see FIG. 5A), a square cross-section (see FIG. 5B), an elliptical cross-section (see FIG. 5C), and/or a rectangular cross-section (See FIG. 5D). As another example, the secondary winding may include a bundle of wires in a rectangular cross-section (see FIG. 5D) where the effective width is less than twice the effective thickness, or an elliptical cross section (see FIG. 5C) where the width is less than twice the thickness, and/or any variation in between a rectangular and elliptical cross section. Various other bundle cross-sections may be used. The small surface area and/or the distance from the center of the transformer core may, for example, result in a lower capacitance.

In some embodiments, both primary winding 415 and the secondary winding 310 may be wound around the same section or leg of the transformer core 430. For example, both primary winding 415 and the secondary winding 310 may be wound around the second core leg 432 of the transformer core 430. As another example, both primary winding 415 and the secondary winding 310 may be wound around the first core leg 431 of the transformer core 430. Any number of primary winding and secondary winding may be wound around any of the sections of the transformer core 430. In some embodiments, there may be a large separation between the primary winding and the secondary winding. In some embodiments, the secondary winding are arranged to reduce the stray capacitance between the secondary winding and the primary winding and/or between multiple different secondary winding. Minimizing the surface area of the secondary winding, for example, may help minimize the stray capacitance.

Figure 5A:
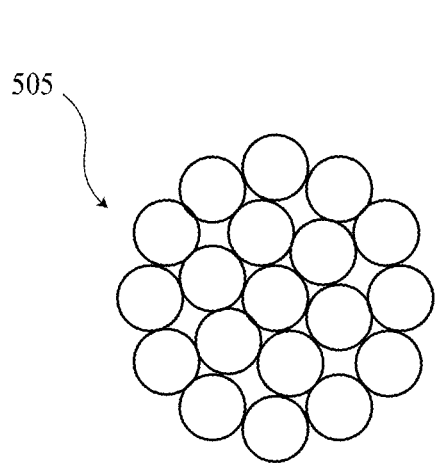
FIG. 5A illustrates a cross-section of a secondary winding according to some embodiments.

FIG. 5A illustrates a cross-section of a secondary winding 505 according to some embodiments. In this example, the bundle of wires comprising the secondary winding may be arranged to have a circular-cross section or hexagonal-cross section.

Figure 5B:
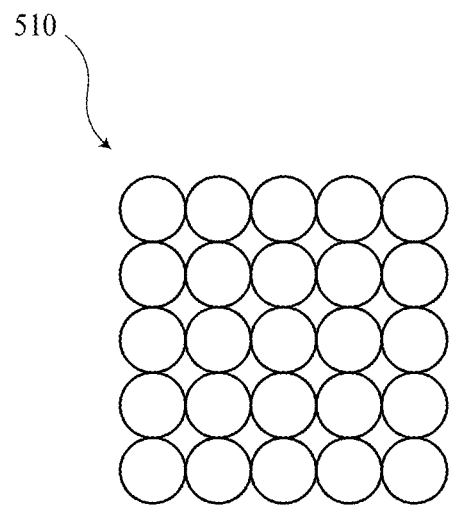
FIG. 5B illustrates a cross-section of a secondary winding according to some embodiments.

FIG. 5B illustrates a cross-section of a secondary winding 510 according to some embodiments. In this example, the bundle of wires comprising the secondary winding may be arranged to have a square-cross section.

Figure 5C:
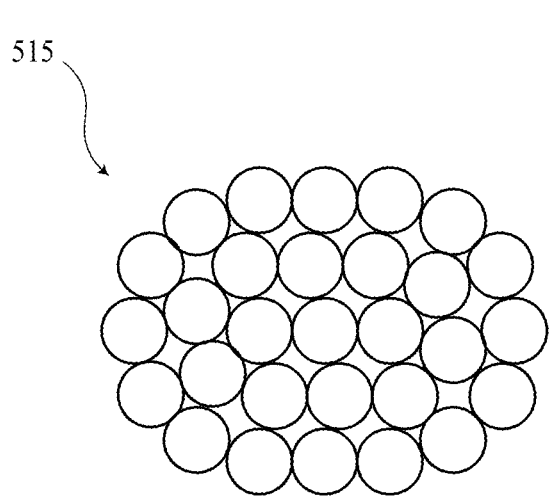
FIG. 5C illustrates a cross-section of a secondary winding according to some embodiments.

FIG. 5C illustrates a cross-section of a secondary winding 515 according to some embodiments. In this example, the bundle of wires comprising the secondary winding may be arranged to have an elliptical-cross section.

Figure 5D:
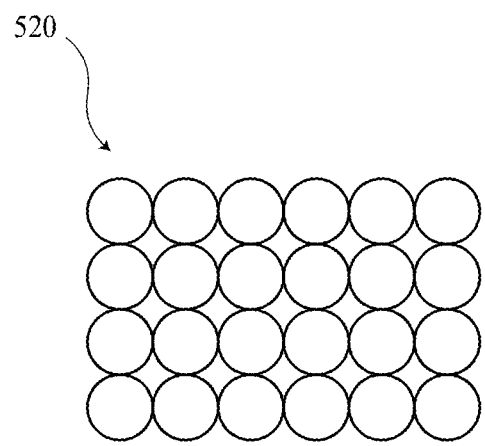
FIG. 5D illustrates a cross-section of a secondary winding according to some embodiments.

FIG. 5D illustrates a cross-section of a secondary winding 520 according to some embodiments. In this example, the bundle of wires comprising the secondary winding may be arranged to have a rectangular-cross section.

In some embodiments, the cross-section of the secondary winding 520 may have a width and a length. In some embodiments, the width to thickness ratio may be less than 3.

Figure 6A:
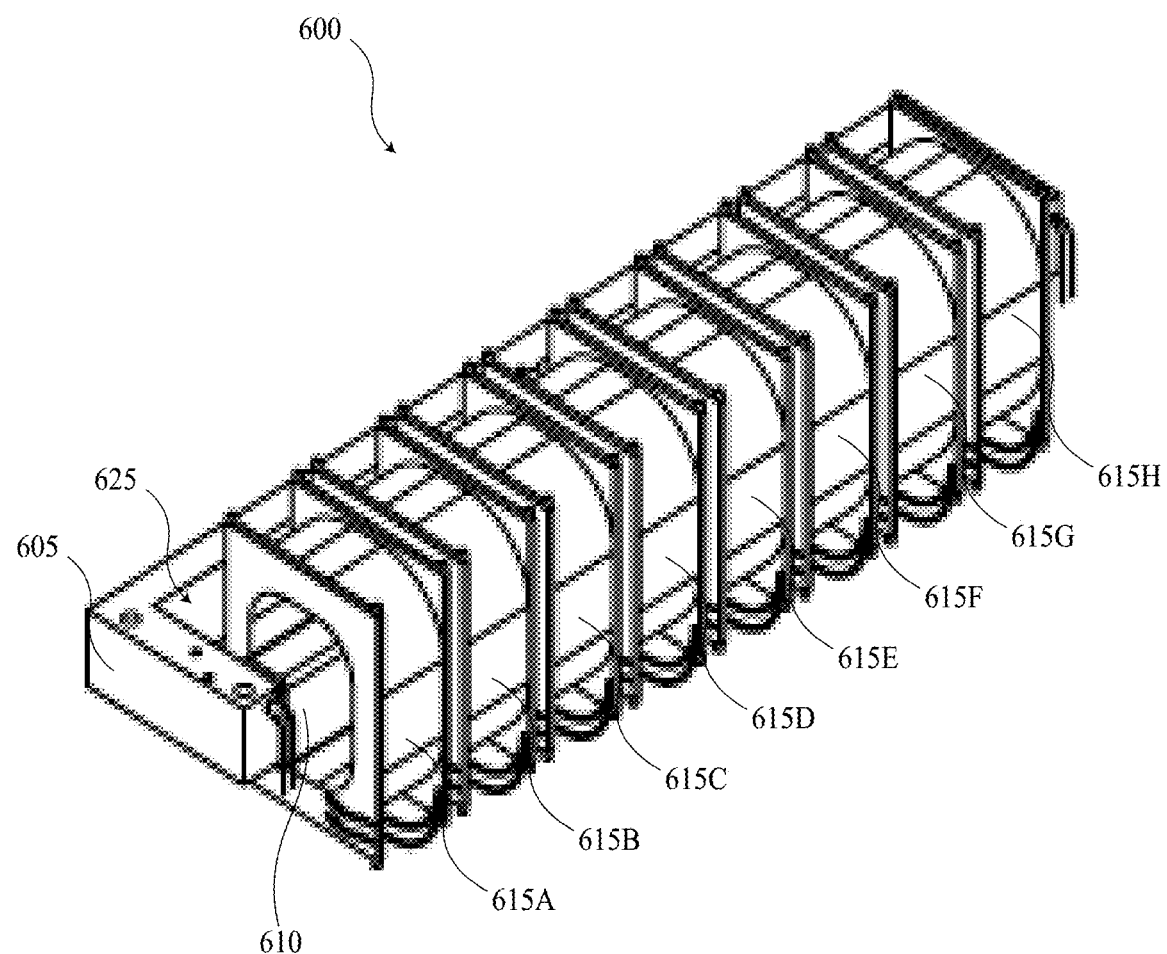
FIG. 6A illustrates an isolation transformer according to some embodiments.
Figure 6B:
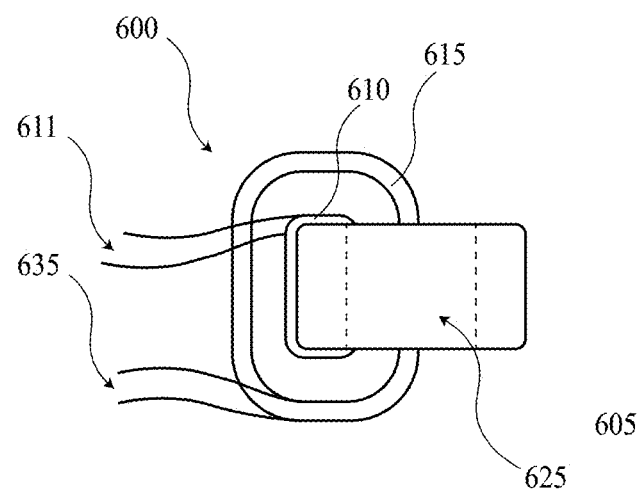
FIG. 6B illustrates an end view of an isolation transformer according to some embodiments

FIG. 6A is an isometric view of an isolation transformer 600 (e.g., isolation transformer 420) according to some embodiments. FIG. 6B illustrates a side view of the isolation transformer 600 according to some embodiments. In some embodiments, isolation transformer 600 may include transformer core 605, primary winding 610 wound about a portion of the transformer core 605, and eight secondary winding 615 wound about portions of the transformer core 605. Any number of secondary winding 615 may be included. In this example, both the primary winding 610 and the secondary winding 615 are wound about the same or substantially the same segment of the transformer core 605. In other embodiments, the primary winding 610 and the secondary winding 615 are wound about the different or substantially different segments of the transformer core 605.

The secondary winding 615 are wound around a portion or leg of the transformer core 605 such that the distance between portions or segments or legs of the transformer core 605 and the secondary winding 615 are maximized. In this example, the secondary winding 615 may pass through the center of the core aperture 625. The primary winding 610 may include electrical leads 611 and each of the secondary winding may include electrical leads 612.

Figure 7:
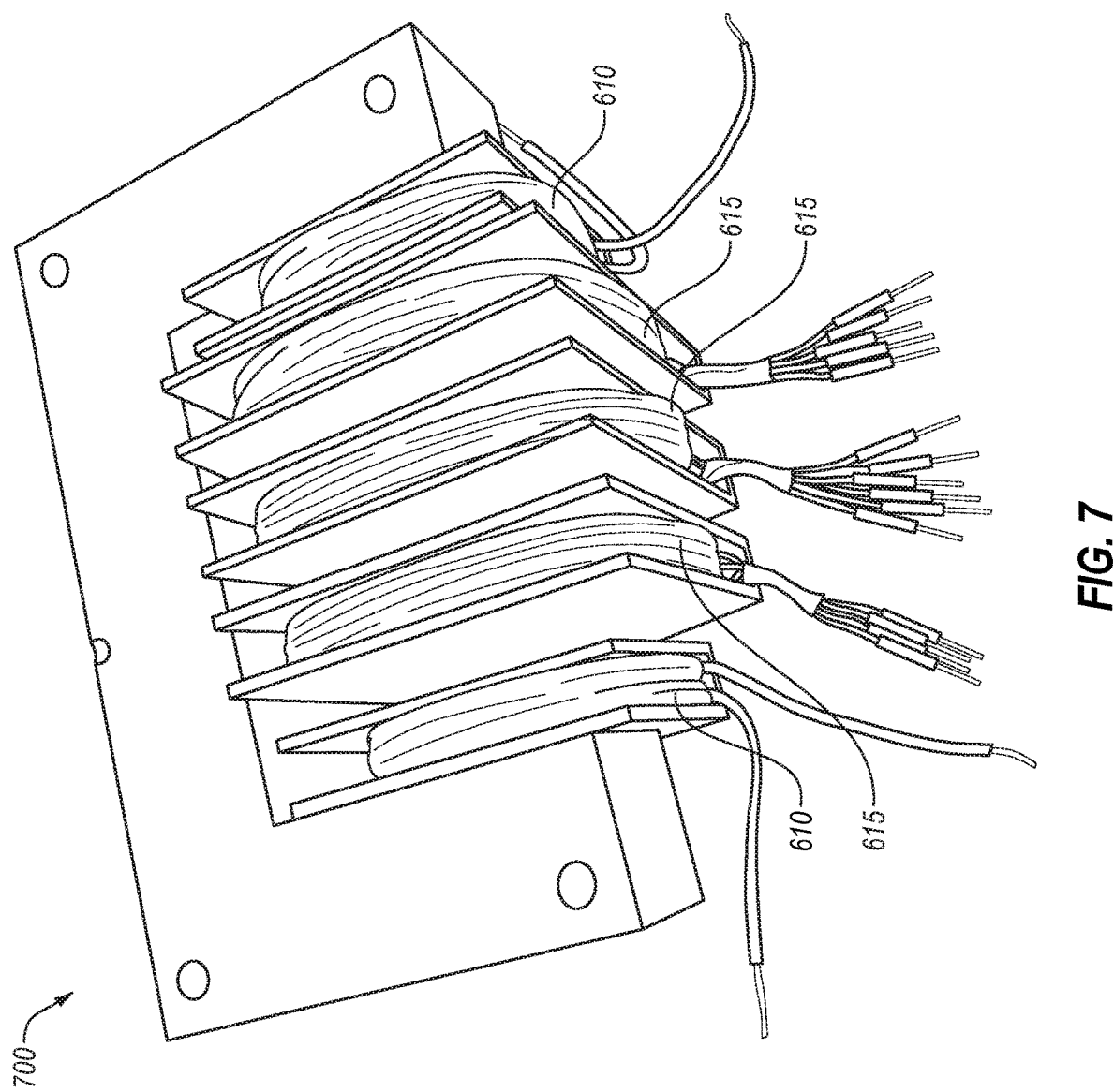
FIG. 7 is an image of an isolation transformer according to some embodiments.

FIG. 7 is an image of an isolation transformer 700 according to some embodiments. In this embodiment, the isolation transformer 700 includes two primary windings 610 and three secondary windings 615. The two primary windings can be wired in series to double the voltage on the primary winding. For example, if the two primary winding are wired in parallel and coupled to 120 VAC source, 120 VAC is applied to the isolation transformer. On the other hand, if the two primary winding are wired in series and 240 VAC source, 240 VAC is applied to the isolation transformer. This transformer, for example, may work with any range of input voltages from 100 VAC to 240 VAC and/or 50 Hz to 60 Hz input frequencies. This may, for example, allows for use with any or all power grids around the world, with the standardly available voltages.

In some embodiments, the ratio of the number of secondary winding to the ratio of the number of primary winding can vary to produce a step-up or a step-down transformer. For example, with 120 VAC applied to the primary winding an output of 19.7 V RMS may be output from each of the secondary winding with a ratio of 6:1 primary winding to secondary winding.

Figure 8:
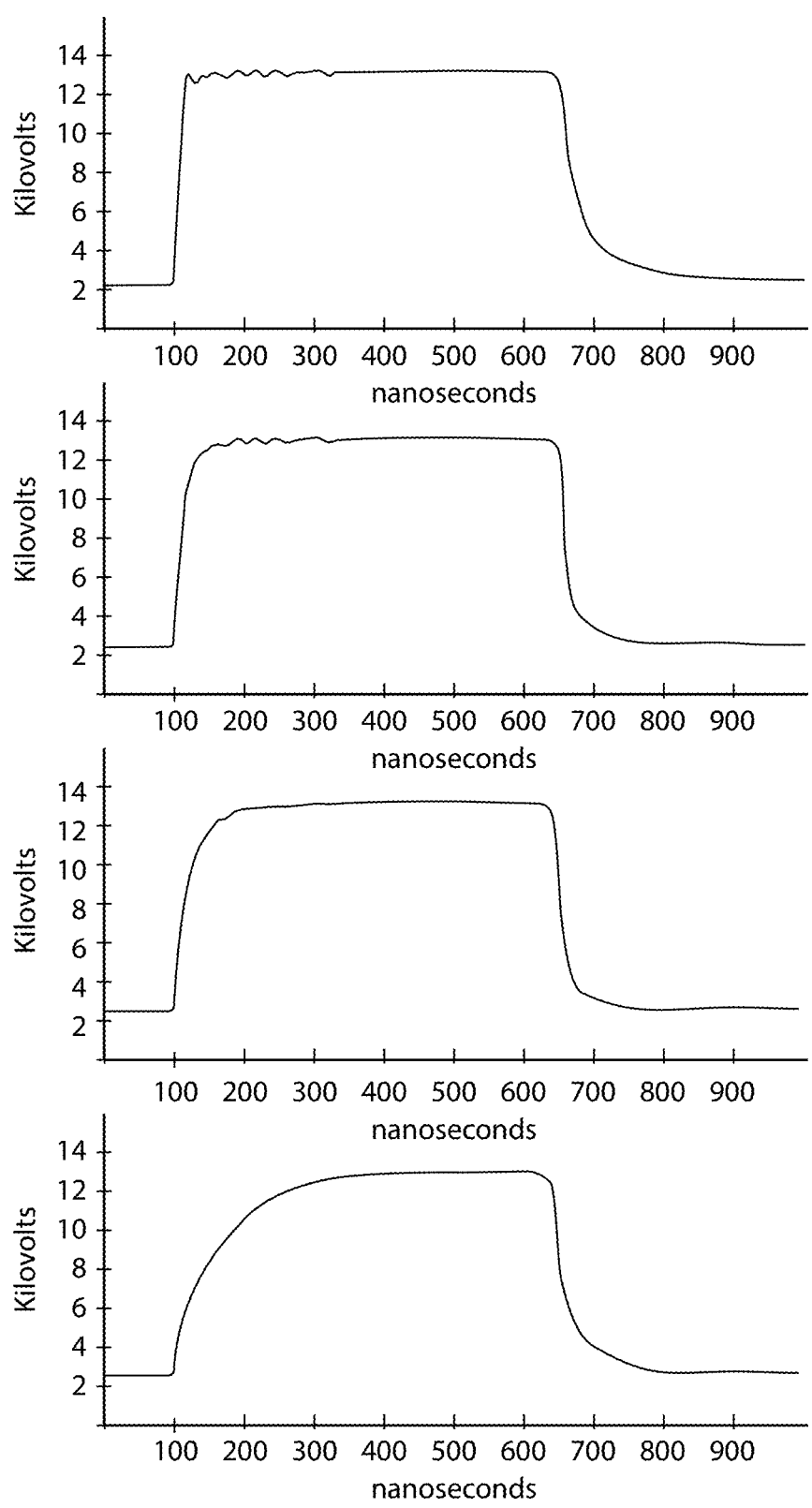
FIG. 8 illustrates four 500 ns waveforms from a high voltage switch that includes sixteen IGBT switch modules.

FIG. 8 illustrates four 500 ns waveforms from a high voltage switch that includes sixteen IGBT switch modules driving different loads. The top waveform is from a high voltage switch driving a pulse across a 500 ohm load, the second to the top waveform is from a high voltage switch driving a pulse across a 200 ohm load, the third waveform is from a high voltage switch driving a 1 pulse across a 00 ohm load, and the bottom is from a high voltage switch driving a pulse across a 50 ohm load.

Figure 9:
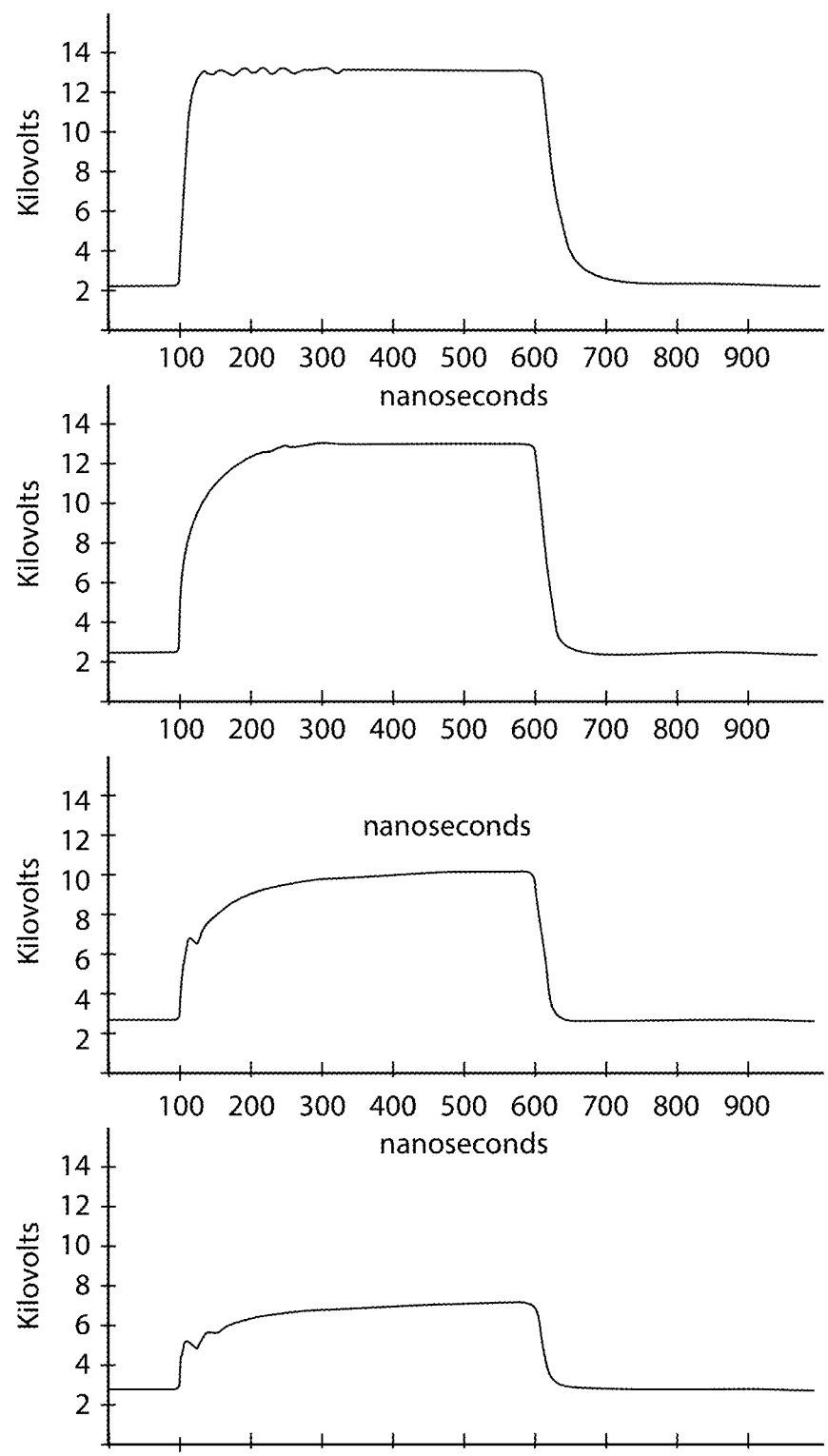
FIG. 9 illustrates four 500 ns waveforms from a high voltage switch that includes sixteen SiC MOSFET switch modules.

FIG. 9 illustrates four 500 ns waveforms from a high voltage switch that includes sixteen SiC MOSFET switch modules driving different loads. The top waveform is from a high voltage switch driving a pulse across a 500 ohm load, the second to the top waveform is from a high voltage switch driving a pulse across a 200 ohm load, the waveform is from a high voltage switch driving a pulse across a 100 ohm load, and the bottom waveform is from a high voltage switch driving a pulse across a 50 ohm load.

Figure 10A:
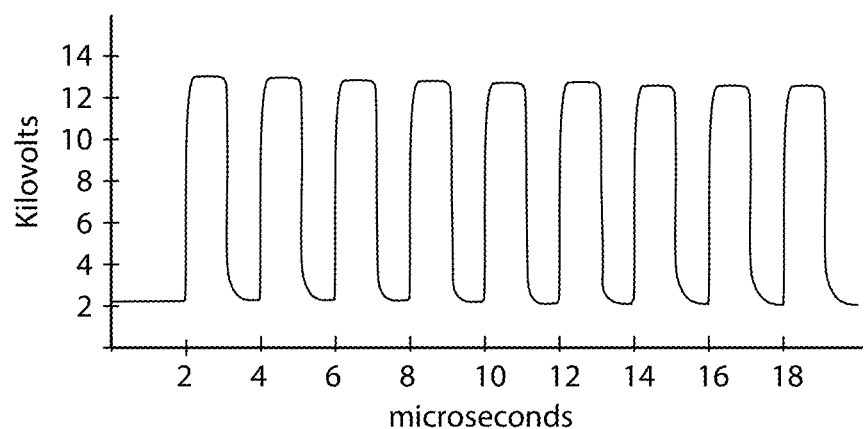
FIG. 10A illustrates a 10 µs, 10 kV waveform from a high voltage switch that includes sixteen IGBT switch modules with a 50 ohm load.

FIG. 10A illustrates a 500 kHz, 12 kV waveform with a 1 μs pulse width from a high voltage switch that includes sixteen IGBT switch modules driving a pulse across a 200 ohm load.

Figure 10B:
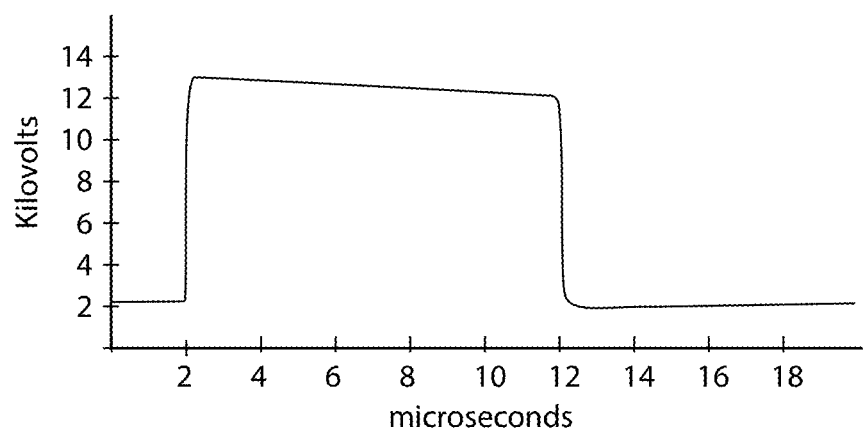
FIG. 10B illustrates a 500 kHz, 12 kV waveform with a 1 µs pulse width from a high voltage switch that includes sixteen IGBT switch modules with a 200 ohm load.

FIG. 10B illustrates a 10 μs, 10 kV burst waveform from a high voltage switch that includes sixteen IGBT switch modules driving a pulse across a 50 ohm load.

Figure 10C:
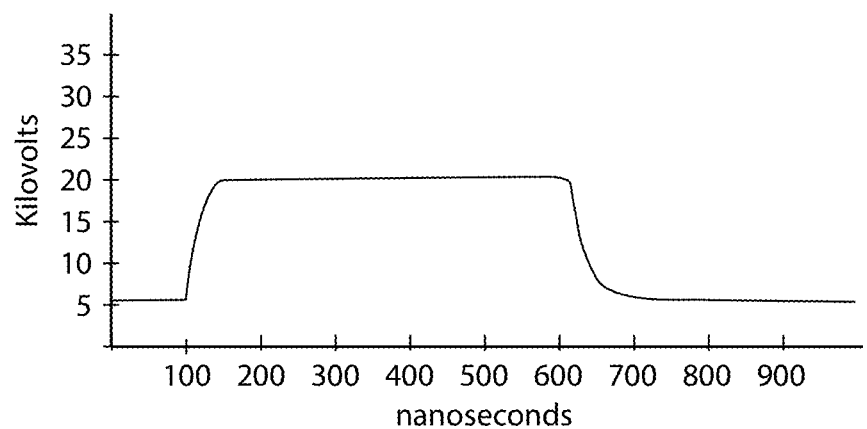
FIG. 10C illustrates a 500 ns, 15 kV waveform from a high voltage switch that includes sixteen IGBT switch modules with a 500 ohm load.

FIG. 10C illustrates a 500 ns, 15 kV waveform from a high voltage switch that includes sixteen IGBT switch modules driving a pulse across a 500 ohm load.

In some embodiments of high voltage switches including IGBT switches, the rise time of a pulse may depend on the load and/or the current. In some embodiments of high voltage switches including IGBT switches, the fall time may depend inversely with the current.

In some embodiments, the high voltage switches may include any type of switch such as, for example, solid state switches, IGBT switches, photoconductive switches, GAN switches, silicon switches, silicon carbide switches, etc.

Figure 11:
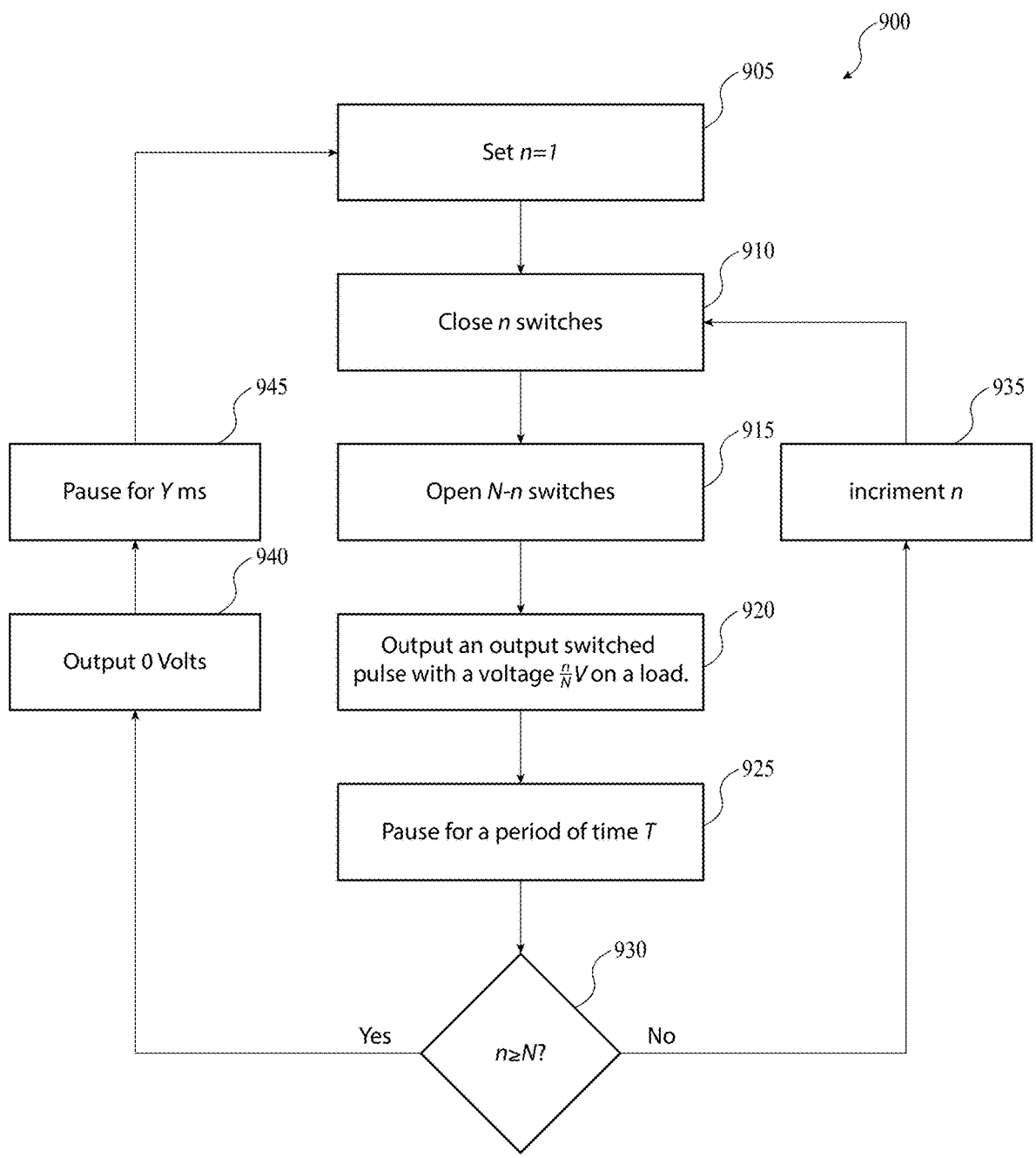
FIG. 11 is flowchart of a method for producing a multi-level waveform using a high voltage switch according to some embodiments.

FIG. 11 is flowchart of a process 900 for producing a multilevel waveform using a high voltage switch according to some embodiments. The process 900 includes a number of blocks that may be arranged or rearranged in any order. The process 900 may be used, for example, with the high voltage switch 100.

The process 900 starts at block 905. At block 905, the counter, n, can be set to one.

At block 910, n switches can be closed. At block 915, the remaining N-n switches can be opened, where N equals the number of switches in the high voltage switch. In some embodiments, block 910 and 915 can occur simultaneously. If n=1, then a single switch will be closed while the remaining switches, N-1, will be open.

At block 920, a voltage $$\frac{n}{N}V$$

will be applied to the load, where V is the high voltage provided by the such as, for example, the high voltage source 160. For example, if n=1 and N=12, then the voltage applied to the load is one-twelfth the high voltage $$\left(\frac{1}{12}V\right).$$

At block 925 the process 900 may pause for a period of time, T The period of time, T, may, for example, be a time less than about 1 s, 500 ms, 100 ms, 50 ms, 25 ms, 10 ms, 5 ms, etc. The maximum time period, T, may be less than a value determined by the value of the snubber capacitor 120 associated with the switch being closed, the stray capacitance in the switch module 105, and/or the stray inductance in the switch module 105. For example, the maximum time period, T, may be set as the amount of time it takes for the snubber capacitor charge prior to reaching the cutoff voltage of the switch such as, for example, 1 ms to 100 ns.

In some embodiments, the snubber components may be sized to handle such operation where switches are opened and closed with varied timings and sequences. This may result in unusually large amounts of energy in the snubber components in the snubber circuit. In some embodiments, the snubber circuit may include switches and/or resistors that may be used remove stored energy from the snubber circuit.

At block 930 it can be determined if the counter, n, is greater than or equal to the total number of switches, N. If the counter, n, is greater than or equal to the total number of switches, N, then process 900 proceeds to block 940. If the counter, n, is not greater than or equal to the total number of switches, N, then process 900 proceeds to block 935.

At block 935, the counter may be incremented and process 900 proceeds to block 910, such as, for example, setting n=n+1. In some embodiments, the counter may be incremented by any positive or negative integer such as, for example, one, two, three, four, five, etc. In some embodiments, the counter may be incremented a different integer value during each iteration.

At block 940, the output voltage is set to zero volts and at block 945 the process 900 pauses for a second period of time, Y, For example, the second period of time, Y, may be equal to the period of time, T. Alternatively, the second period of time, Y, may be set to any period of time greater or lesser than the period of time, T The output waveform produced by the process 900 may include the waveform shown in FIG. 12B.

In some embodiments, the process 900 may step down the output pulse voltage. For example, at block 930, it can be determined whether the counter, n, is greater than zero. If the counter, n, is greater than zero, then process 900 can proceed to block 930 where the counter, n, is decremented by an integer (e.g., incremented by a negative integer). If the counter, n, is zero, the process 900 can proceed to block 940. The output waveform produced by the process 900 may include the waveform shown in FIG. 12B.

Figure 12A:
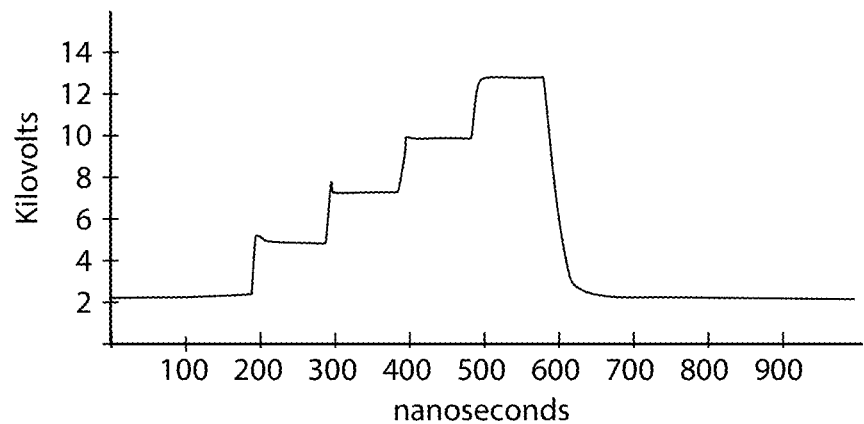
FIG. 12A illustrates an upward pulse-step waveform produced from a high voltage switch according to some embodiments.
Figure 12B:
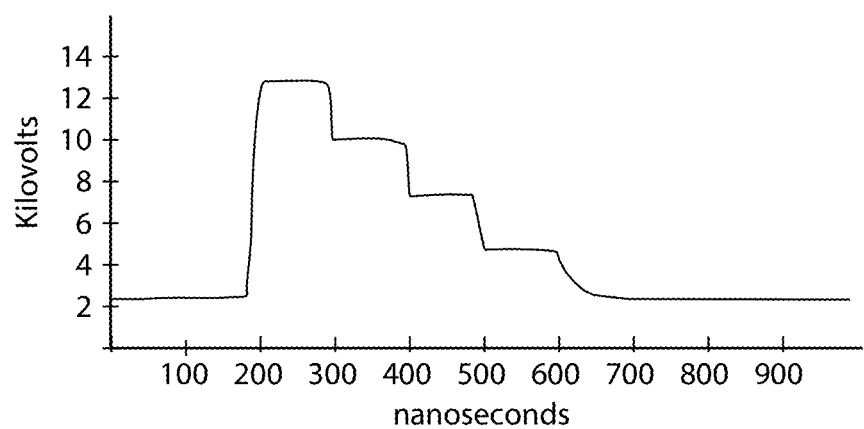
FIG. 12B illustrates a downward pulse-step waveform produced from a high voltage switch according to some embodiments.

In some embodiments, a method can produce an upward pulse-step waveform (e.g., as shown in FIG. 12A) followed by producing a downward pulse-step waveform (e.g., as shown in FIG. 12B).

FIG. 12A illustrates an upward pulse-step waveform produced from a high voltage switch according to some embodiments.

FIG. 12B illustrates a downward pulse-step waveform produced from a high voltage switch according to some embodiments.

Unless otherwise specified, the term "substantially" means within 5% or 10% of the value referred to or within manufacturing tolerances. Unless otherwise specified, the term "about" means within 5% or 10% of the value referred to or within manufacturing tolerances.

Figure 13:
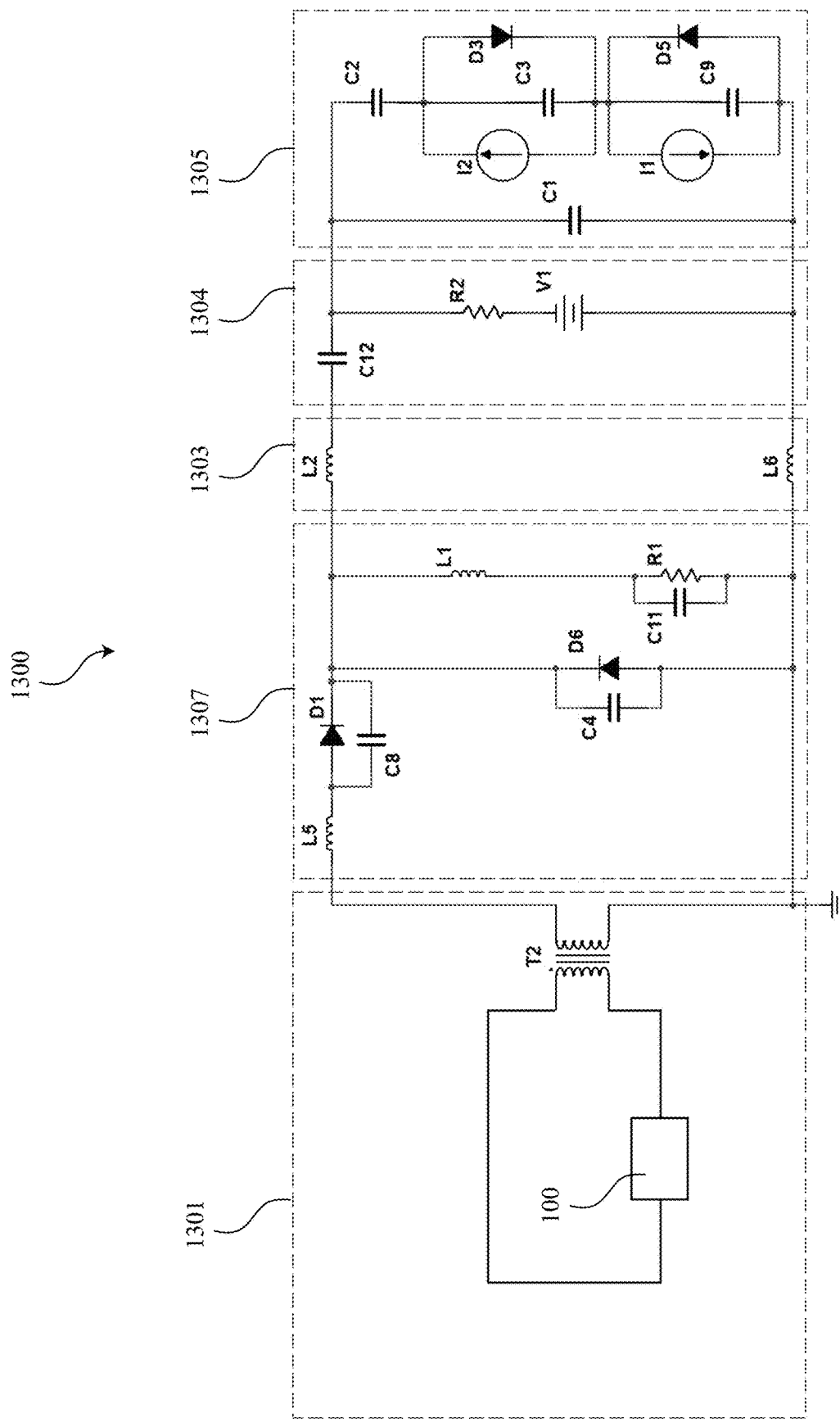
FIG. 13 is a circuit diagram of a high voltage etch system according to some embodiments.

FIG. 13 is a circuit diagram of a high voltage etch system 1300 according to some embodiments. The high voltage etch system 1300 can be generalized into five stages (these stages could be broken down into other stages or generalized into fewer stages and/or may or may not include the components shown in the figure). The high voltage etch system 1300 may include high voltage switch and transformer stage 1301, a resistive output stage 1302, a lead stage 1303, a DC bias power supply stage 1304, and a load stage 1305.

In some embodiments, the high voltage etch system 1300 can produce pulses from the power supply with voltages greater than 5 kV, with rise times less than about 20 ns, and frequencies greater than about 130 kHz.

In some embodiments, the high voltage switch and transformer stage 1301 can produce a plurality of high voltage pulses with a high frequency and fast rise times and fall times.

In some embodiments, the high voltage switch and transformer stage 1301 can include one or more high voltage switches 100, which may include any high voltage switch disclosed or described in this document.

In some embodiments, the load stage 1305 may represent an effective circuit for a plasma deposition system, plasma etch system, or plasma sputtering system. In some embodiments, the plasma etch system may include effective components that represent the physics of the plasma and or a wafer. The capacitance C2 may represent the capacitance of the dielectric material upon which a wafer may sit. The capacitor C3 may represent the sheath capacitance of the plasma to the wafer. The capacitor C9 may represent capacitance within the plasma between a chamber wall and the top surface of the wafer. The current source I2 and the current source I1 may represent the ion current through the sheath.

In some embodiments, the load stage 1305 may represent a plasma type load. In some embodiments, the plasma load may have a capacitance less than about 100 nF, 50 nF, 20 nF, 10 nF, etc.

In some embodiments, the resistive output stage 1302 may include one or more inductive elements represented by inductor L1 and/or inductor L5. The inductor L5, for example, may represent the stray inductance of the leads in the resistive output stage 1302. Inductor L1 may be set to minimize the power that flows directly from the high voltage switch and transformer stage 1301 into resistor R1.

In some embodiments, the resistor R1 may dissipate charge from the load stage 1305, for example, on fast time scales (e.g., 1 ns, 130 ns, 50 ns, 1300 ns, 250 ns, 500 ns, 1,000 ns, etc. time scales). The resistance of resistor R1 may be low to ensure the pulse across the load stage 1305 has a fast fall time $t_f$.

In some embodiments, the resistor R1 may include a plurality of resistors arranged in series and/or parallel. The capacitor C11 may represent the stray capacitance of the resistor R1 including the capacitance of the arrangement series and/or parallel resistors. The capacitance of stray capacitance C11, for example, may be less than 500 pF, 250 pF, 1300 pF, 50 pF, 130 pF, 1 pF, etc. The capacitance of stray capacitance C11, for example, may be less than the load capacitance such as, for example, less than the capacitance of C2, C3, and/or C9.

In some embodiments, a plurality of high voltage and transformer stages 1301 can be ganged up in parallel and coupled with the resistive output stage 1302 across the inductor L1 and/or the resistor R1. Each of the plurality of high voltage switch and transformer stages 1301 may each also include diode D1 and/or diode D6.

In some embodiments, the capacitor C8 may represent the stray capacitance of the blocking diode D1. In some embodiments, the capacitor C4 may represent the stray capacitance of the diode D6.

In some embodiments, the DC bias power supply stage 1304 may include DC a voltage source V1 that can be used to bias the output voltage either positively or negatively. In some embodiments, the capacitor C12 isolates/separates the DC bias voltage from the resistive output stage and other circuit elements. It allows for a potential shift from one portion of the circuit to another. In some applications the potential shift it establishes is used to hold a wafer in place. Resistance R2 may protect/isolate the DC bias supply from the high voltage pulsed output from the high voltage switch and transformer stage 1301.

Figure 14:
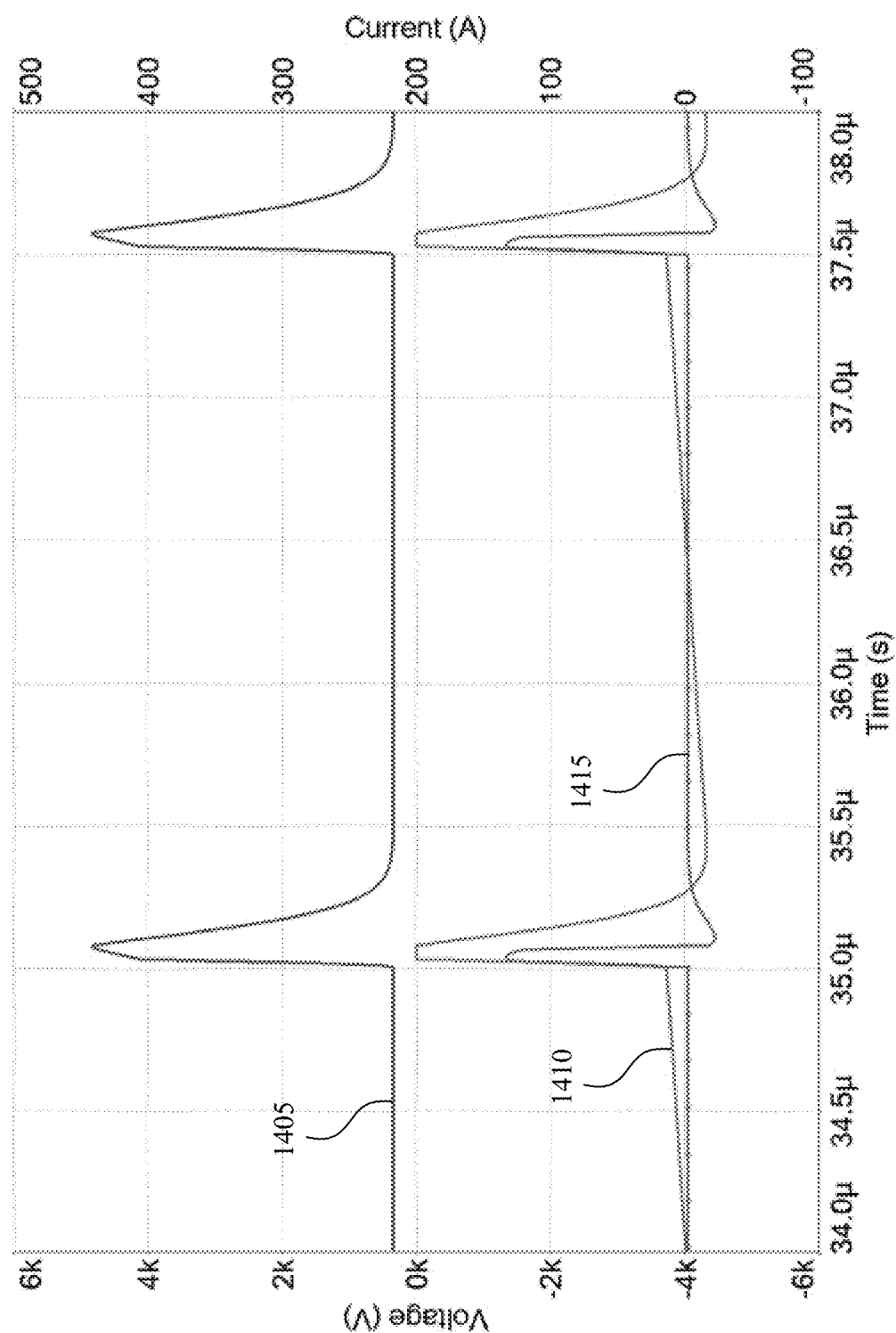
FIG. 14 shows example waveforms produced by the high voltage etch system.

FIG. 14 shows example waveforms produced by the high voltage etch system 1300. In these example waveforms, the pulse waveform 1405 may represent the voltage provided by the high voltage switch and transformer stage 1301. As shown, the pulse waveform 1405 produces a pulse with the following qualities: high voltage (e.g., greater than about 4 kV as shown in the waveform), a fast rise time (e.g., less than about 200 ns as shown in the waveform), a fast fall time (e.g., less than about 200 ns as shown in the waveform), and short pulse width (e.g., less than about 300 ns as shown in the waveform). The waveform 1410 may represent the voltage at the surface of a wafer represented in circuit 1300 by the point between capacitor C2 and capacitor C3 or the voltage across capacitor C3. The pulse waveform 1415 represent the current flowing from the switch and transformer stage 1301 to the plasma. The circuit 1300 may or may not include either or both diodes D1 or D2.

During the transient state (e.g., during an initial number of pulses not shown in the figure), the high voltage pulses from the switch and transformer stage 1301 charge the capacitor C2. Because the capacitance of capacitor C2 is large compared to the capacitance of capacitor C3 and/or capacitor C1, and and/or because of the short pulse widths of the pulses, the capacitor C2 may take a number of pulses from the high voltage switch to fully charge. Once the capacitor C2 is charged the circuit reaches a steady state, as shown by the waveforms in FIG. 14.

In steady state and when the switch S1 is open, the capacitor C2 is charged and slowly dissipates through the resistive output stage 1310, as shown by the slightly rising slope of waveform 1410. Once the capacitor C2 is charged and while the switch S1 is open, the voltage at the surface of the wafer (the point between capacitor C2 and capacitor C3) is negative. This negative voltage may be the negative value of the voltage of the pulses provided by the high voltage switch and transformer stage 1301. For the example waveform shown in FIG. 14, the voltage of each pulse is about 4 kV; and the steady state voltage at the wafer is about −4 kV. This results in a negative potential across the plasma (e.g., across capacitor C3) that accelerates positive ions from the plasma to the surface of the wafer. While the switch S1 is open, the charge on capacitor C2 slowly dissipates through the resistive output stage.

When the switch S1 is closed, the voltage across the capacitor C2 may flip (the pulse from the high voltage switch 100 is high as shown in waveform 1405) as the capacitor C2 is charged. In addition, the voltage at the point between capacitor C2 and capacitor C3 (e.g., at the surface of the wafer) changes to about zero as the capacitor C2 charges, as shown in waveform 1410. Thus, the pulses from the high voltage switch 100 produce a plasma potential (e.g., a potential in a plasma) that rise from a negative high voltage to zero and returns to the negative high voltage at high frequencies, with fast rise times, fast fall times, and/or short pulse widths.

In some embodiments, the action of the resistive output stage, elements represented by the resistive output stage 1302, that may rapidly discharge the stray capacitance C1, and may allow the voltage at the point between capacitor C2 and capacitor C3 to rapidly return to its steady negative value of about −4 kV as shown by waveform 1410. The resistive output stage may allow the voltage at the point between capacitor C2 and capacitor C3 to exists for about % of the time, and thus maximizes the time which ions are accelerated into the wafer. In some embodiments, the components contained within the resistive output stage may be specifically selected to optimize the time during which the ions are accelerated into the wafer, and to hold the voltage during this time approximately constant. Thus, for example, a short pulse with fast rise time and a fast fall time may be useful, so there can be a long period of fairly uniform negative potential.

Various other waveforms may be produced by the high voltage etch system 1300.

In some embodiments, a bias compensation subsystem can be used to adjust the chucking voltage in a semiconductor fabrication wafer chamber. A chucking voltage can be applied to the chuck to track the on/off pattern of the pulse bias generator bursts, for example, so that there is a constant voltage difference.

Figure 15:
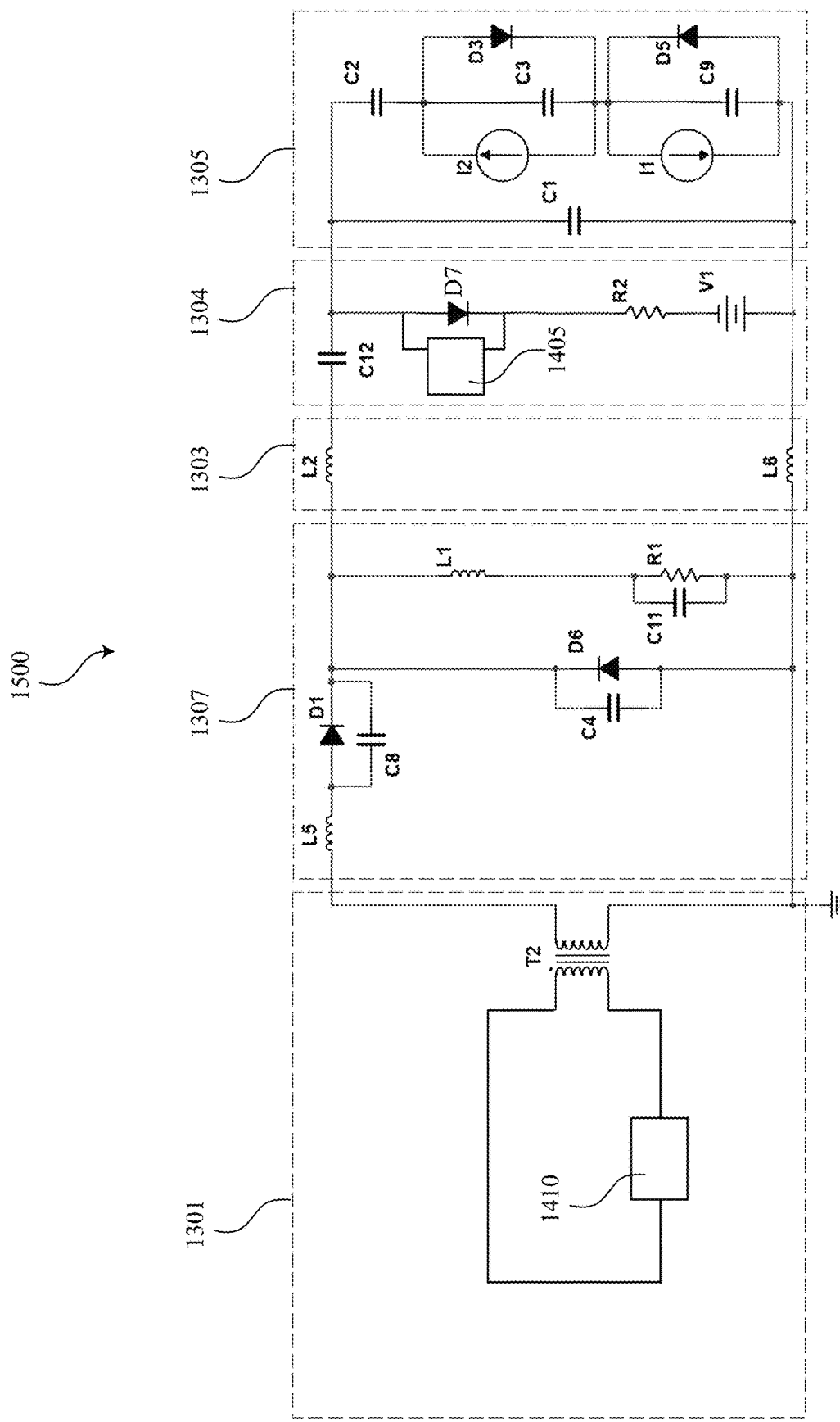
FIG. 15 is a circuit diagram of a high voltage etch system according to some embodiments.

FIG. 15 is a circuit diagram of a high voltage etch system 1500 according to some embodiments. In some embodiments, the high voltage etch system 1500 may include a high voltage switch 1405 coupled across a blocking diode D7 at, near or within the resistive output stage 1302 and or the DC bias power supply stage 1304.

In some embodiments, the high voltage switch 1405 may be open while the switch 1410 is pulsing and closed when the switch 1410 is not pulsing. While closed, the high voltage switch 1405 may, for example, short current across diode D7. Shorting this current may allow the bias between the wafer and the chuck to be less than 2 kV, which may be within acceptable tolerances. The switch 1410 may be any power supply such as, for example, a high voltage switch 100, a nanosecond pulser, an RF power supply, etc.

Various embodiments are disclosed. The various embodiments may be partially or completely combined to produce other embodiments.

Numerous specific details are set forth herein to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A high voltage switch comprising:
   a high voltage power supply having a voltage greater than 5 kV;
   a first switch module comprising:
      a first switch having a first voltage rating;
      a first transformer electrically or inductively coupled with a control voltage power source and electrically or inductively coupled with the first switch, providing a voltage less than the first voltage rating; and
      a first switch trigger electrically or inductively coupled with the first switch;
   a second switch module arranged in series with the first switch module, the second switch module comprising:
      a second switch having a second voltage rating;
      a second transformer electrically or inductively coupled with the control voltage power electrically or inductively and electrically coupled with the second switch, providing a voltage less than the second voltage rating; and
      a second switch trigger electrically or inductively coupled with the second switch, wherein the second switch trigger is independently triggered relative to the first switch trigger, and
   a plasma electrically or inductively coupled with the first switch module and/or the second switch module, the plasma having a capacitance less than about 20 nF, and the plasma receiving pulses from the high voltage power supply greater than either the first switch voltage rating and/or the second switch voltage rating.

2. The high voltage switch according to claim 1, wherein the first switch trigger produces a trigger having a rise time less than about 20 ns.

3. The high voltage switch according to claim 1, wherein the switched pulses have a frequency greater than about 40 kHz.

4. The high voltage switch according to claim 1, wherein the switched pulses have a rise time less than about 75 ns.

5. The high voltage switch according to claim 1, wherein the switched pulses have a fall time less than 100 ns.

6. The high voltage switch according to claim 1, wherein the period of time where the first switch is closed while the second switch is open is less than 1 ms.

7. The high voltage switch according to claim 1, wherein the stray capacitance of the high voltage switch is less than about 100 pF.

8. The high voltage switch according to claim 1, wherein the stray inductance of either or both the first switch module or the second switch module less than 300 nH.

9. The high voltage switch according to claim 1, wherein the control voltage power source provides AC line voltages and frequencies.

10. The high voltage switch according to claim 1, wherein the control voltage power source provides 120 VAC at 60 Hz.

11. The high voltage switch according to claim 1, further comprising a first plurality of secondary windings and a first plurality of primary windings having a stray capacitance between the first plurality of secondary windings and the first plurality of primary windings is less than 100 pF.

12. The high voltage switch according to claim 1, further comprising:

a transformer core; and a plurality of primary windings wound around the transformer core, the plurality of primary windings being coupled with the control voltage power source, wherein the first transformer comprises the transformer, the plurality of primary windings, and a first plurality of secondary windings wound around the transformer; and wherein the second transformer comprises the transformer, the plurality of primary windings, and a second plurality of secondary windings wound around the transformer.

13. A high voltage switch comprising:

a high voltage power supply providing power greater than about 5 kV;

a control voltage power source;

a plurality of switch modules arranged in series with respect to each other, each of the plurality of switch modules configured to switch power from the high voltage power supply, each of the plurality of switch modules comprising:

a switch having a collector, an emitter, and a gate, and a voltage rating;

a transformer electrically or inductively coupled with the control voltage power source and electrically or inductively coupled with the switch; and a gate trigger electrically or inductively coupled with the gate of the switch, wherein the switch is opened and closed based on a signal from the gate trigger; and an output configured to output a pulsed output signal having a voltage greater than the rating of any switch of the plurality of switch modules, a pulse width less than 2 μs, and at a pulse frequency greater than 10 kHz;

wherein each gate trigger of each of the plurality of switch modules are independently triggered.

14. The high voltage switch according to claim 13, further comprising a plasma electrically or inductively coupled with the output and having a capacitance less than about 20 nF.

15. The high voltage switch according to claim 13, wherein the pulsed output signal includes pulses having a rate of rise greater than $10^{11}$ V/s.

16. The high voltage switch according to claim 13, wherein one or more switch modules of the plurality of switch modules produce less than 50 ns of jitter.

17. The high voltage switch according to claim 13, wherein the output is electrically or inductively coupled with a plasma load.

18. The high voltage switch according to claim 13, wherein the transformer comprises a transformer core and a secondary winding, wherein the average gap between the transformer core and the majority of the secondary winding is greater than 0.5 inches.

19. The high voltage switch according to claim 13, wherein the transformer comprises a transformer core, a primary winding, and a secondary winding, wherein the average gap between the majority of the primary winding and the majority of the secondary winding is greater than 0.5 inches.

20. The high voltage switch according to claim 13, wherein each switch module is configured to switch at least 5 W of power.

21. The high voltage switch according to claim 13, wherein the transformer comprises a transformer core and a secondary winding, wherein the secondary winding comprises a plurality of wires having a cross section with a width to thickness ratio less than 3.

22. The high voltage switch according to claim 13, wherein the gate trigger comprises an isolated fiber optic trigger.

23. A method comprising:

closing a first switch of a plurality of switches, the plurality of switches comprising n switches, while opening n−1 switches of the plurality of switches for a first plurality of time, wherein the plurality of switches are electrically and/or inductively coupled with a power supply that produces a high voltage V that is greater than 5 kV;

outputting an output switched pulses with a voltage $$\frac{1}{n}V$$

on a load;

closing a second switch of the plurality of switches while opening n−2 switches of the plurality of switches for a second period of time;

outputting the output switched pulses with a voltage $$\frac{2}{n}V$$

on the load;

closing a second-to-last switch of the plurality of switches while opening one switches of the plurality of switches for a second-to-last period of time;

outputting the output switched pulses with a voltage $$\frac{n-1}{n}V$$

on the load;

closing an $n^{th}$ switch of the plurality of switches for an $n^{th}$ period of time; and outputting the output switched pulses with a voltage V on the load.

24. The method according to claim 23, wherein the load comprises a plasma having a capacitance less than about 20 nF.

25. The method according to claim 23, wherein one or more of the first period of time, the second period of time, the second-to-last period of time, and the $n^{th}$ period of time are less than 100 ms.

26. The method according to claim 23, wherein the output switched pulses have a rise time less than about 20 ns.

27. The method according to claim 23, wherein the output switched pulses have a frequency greater than about 10 kHz.

28. The method according to claim 23, wherein the output wherein one or more of the first period of time, the second period of time, the second-to-last period of time, and the $n^{th}$ period of time are less than 5 ms.

* * * * *